(12) United States Patent
Ikoma

(10) Patent No.: US 7,982,644 B2
(45) Date of Patent: Jul. 19, 2011

(54) D/A CONVERTER AND SEMICONDUCTOR INTEGRATED CIRCUIT INCLUDING THE SAME

(75) Inventor: Heiji Ikoma, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/887,969

(22) Filed: Sep. 22, 2010

(65) Prior Publication Data

US 2011/0012770 A1   Jan. 20, 2011

Related U.S. Application Data

(62) Division of application No. 11/919,126, filed as application No. PCT/JP2005/02003 on Oct. 31, 2005, now Pat. No. 7,825,843.

(30) Foreign Application Priority Data

May 20, 2005 (JP) .................................. 2005-148199

(51) Int. Cl.
*H03M 1/00* (2006.01)

(52) U.S. Cl. ........................................ 341/136; 330/310

(58) Field of Classification Search .......... 341/110–155; 330/310; 326/86
See application file for complete search history.

(56) References Cited

U.S. PATENT DOCUMENTS

| 4,914,614 | A | 4/1990 | Yamakawa |
| 5,751,711 | A | 5/1998 | Sakaue |
| 6,281,825 | B1 | 8/2001 | Lee |
| 6,310,568 | B1 | 10/2001 | Kurooka |
| 6,738,006 | B1 * | 5/2004 | Mercer et al. ................. 341/144 |
| 7,417,463 | B1 | 8/2008 | Danesh et al. |
| 7,466,252 | B1 | 12/2008 | Radulov et al. |
| 7,626,424 | B2 | 12/2009 | Danesh et al. |
| 7,825,843 | B2 * | 11/2010 | Ikoma ........................... 341/144 |
| 2004/0070578 | A1 | 4/2004 | Kasai |

FOREIGN PATENT DOCUMENTS

| JP | 5-218875 | 8/1993 |
| JP | 2001-156638 | 6/2001 |
| JP | 2004-088158 | 3/2004 |
| JP | 2004-349814 | 12/2004 |

OTHER PUBLICATIONS

Bosch, A., et al., "A 10-bit 1-GSample/s Nyquist Current-Steering CMOS D/A Converter", IEEE Journal of Solid-state Circuits, Mar. 2001, pp. 315-323, vol. 36 No. 3, IEEE.

* cited by examiner

*Primary Examiner* — Lam T Mai

(74) *Attorney, Agent, or Firm* — McDermott Will & Emery LLP

(57) ABSTRACT

In a current steering D/A converter, a 1LSB current source 1 and a 2LSB current source 2 are binary code current sources for outputting currents with current values weighted by ½, and a 4LSB current source 3 is one of a large number of current sources designed as thermometer code current source with the same structure. In first circuits A1, A2 and A4 for respectively determining constant current values of the current sources 1 through 3, a plurality of MOS transistors with a channel length L3 and a channel width W3 are cascode-connected to one another with gate terminals thereof shared. In second circuits B1, B2 and B4 respectively used for setting high output impedance of the current sources 1 through 3, a plurality of MOS transistors with a channel length L4 and a channel width W4 are cascode-connected to one another with gate terminals thereof shared. Accordingly, the current characteristics of the current sources can be made more uniform while reducing their circuit areas, resulting in improving the linearity of the D/A conversion characteristic.

6 Claims, 19 Drawing Sheets

D/A CONVERTER AND SEMICONDUCTOR INTEGRATED CIRCUIT INCLUDING THE SAME

RELATED APPLICATIONS

This application is a Divisional of U.S. patent application Ser. No. 11/919,126, filed on Oct. 24, 2007, now U.S. Pat. No. 7,825,843, which is a U.S. National Phase under 35 U.S.C. §371 of International Application No. PCT/JP2005/020003, filed on Oct. 31, 2005, which in turn claims the benefit of Japanese Application No. 2005-148199, filed on May 20, 2005, the disclosures of which Applications are incorporated by reference herein.

TECHNICAL FIELD

The present invention relates to a D/A converter for converting a set of digital signals into an analog signal. More particularly, it relates to a technique for achieving reduction in current variation in and area of a current source matrix of a D/A converter.

BACKGROUND ART

Recently, system LSIs including digital circuits and analog circuits mixedly built on one chip are being extensively fabricated using CMOS technology which is cheaper.

In such an LSI, an A/D converter for converting an analog signal into a set of digital signals and a D/A converter for converting a set of digital signals into an analog signal are used in an interface with the outside of the LSI.

When such an LSI is used for imaging or communications, a current steering D/A converter capable of a high speed operation is indispensable.

FIG. 13 shows the circuit configuration of a conventional current steering D/A converter 100. In this drawing, conversion of 8-bit digital signals into an analog signal is exemplified.

A voltage generated by a bias circuit 104 is applied to a first bias voltage terminal VB1 and a second bias voltage terminal VB2 of each of current sources IS1, IS2 and IS3-1 through IS3-63. A Current output from each of the current sources IS1, IS2 and IS3-1 through IS3-63 is allowed to flow to an analog output terminal OUT or a ground power supply VSS respectively by a corresponding one of differential switches SW1, SW2 and SW3-1 through SW3-63 controlled in accordance with a set of digital input signals. An analog current output in accordance with the digital input signals can be obtained from the analog output terminal OUT. The analog output current is converted into a voltage by an output load resistor 101.

The current source IS1 is a 1LSB (least significant bit) current source and the current source IS2 is a 2LSB current source. Also, the current sources IS3-1 through IS3-63 are 4LSB current sources and are sixty-three in total in number. By combining currents supplied from these current sources, analog outputs of 256 ($=2^8$) tones can be obtained.

The bias circuit 104 generates two bias voltages VB1 and VB2 in accordance with a voltage supplied from a reference voltage generator circuit 103 to its reference voltage input terminal VREF and an external resistor 102 connected to its reference resistor connecting terminal IREF.

Furthermore, a decoder circuit 105 decodes 8-bit digital signals input to its digital input terminals IN0 through IN7 for outputting differential switch control signals D1, D2 and D3-1 through D3-63.

Each current source used in this conventional current steering D/A converter has the following circuit configuration:

FIG. 14 shows a first exemplified circuit configuration of the conventional current sources. In FIG. 14, in a current source 111, the source terminal of a P-channel transistor Tr111 with a channel length L1 and a channel width W1 is connected to a power supply VDD, the gate terminal thereof is connected to a first bias voltage terminal VB1 and the drain terminal thereof is connected to the source terminal of a P-channel transistor Tr112 with a channel length L2 and a channel width W1, and the gate terminal of the transistor Tr112 is connected to a second bias voltage terminal VB2 and the drain terminal thereof is connected to a current output terminal Iout111. Thus, the current source 111 is able to output a current with a current value corresponding to 1LSB.

Furthermore, in a current source 112, the source terminal of a P-channel transistor Tr113 with a channel length L1 and a channel width W1 is connected to a power supply VDD, the gate terminal thereof is connected to a first bias voltage terminal VB1 and the drain terminal thereof is connected to the source terminal of a P-channel transistor Tr114 with a channel length L2 and a channel width W1, and the gate terminal of the transistor Tr114 is connected to a second bias voltage terminal VB2 and the drain terminal thereof is connected to a current output terminal Iout112, and the source terminal of a P-channel transistor Tr115 with a channel length L1 and a channel width W1 is connected to a power supply VDD, the gate terminal thereof is connected to the first bias voltage terminal VB1 and the drain terminal thereof is connected to the source terminal of a P-channel transistor Tr116 with a channel length L2 and a channel width W1, and the gate terminal of the transistor Tr116 is connected to the second bias voltage terminal VB2 and the drain terminal thereof is connected to the current output terminal Iout112. Thus, the current source 112 is able to output a current with a current value corresponding to 2LSB.

Moreover, in a current source 113, the source terminal of a P-channel transistor Tr117 with a channel length L1 and a channel width W1 is connected to a power supply VDD, the gate terminal thereof is connected to a first bias voltage terminal VB1 and the drain terminal thereof is connected to the source terminal of a P-channel transistor Tr118 with a channel length L2 and a channel width W1. The gate terminal of the transistor Tr118 is connected to a second bias voltage terminal VB2 and the drain terminal thereof is connected to a current output terminal Iout113, and the source terminal of a P-channel transistor Tr119 with a channel length L1 and a channel width W1 is connected to a power supply VDD, the gate terminal thereof is connected to the first bias voltage terminal VB1 and the drain terminal thereof is connected to the source terminal of a P-channel transistor Tr120 with a channel length L2 and a channel width W1. The gate terminal of the transistor Tr120 is connected to the second bias voltage terminal VB2, the drain terminal thereof is connected to the current output terminal Iout113, and the source terminal of a P-channel transistor Tr121 with a channel length L1 and a channel width W1 is connected to a power supply VDD, the gate terminal thereof is connected to the first bias voltage terminal VB1 and the drain terminal thereof is connected to the source terminal of a P-channel transistor Tr122 with a channel length L2 and a channel width W1. The gate terminal of the transistor Tr122 is connected to the second bias voltage terminal VB2 and the drain terminal thereof is connected to the current output terminal Iout113, and the source terminal of a P-channel transistor Tr123 with a channel length L1 and a channel width W1 is connected to a power supply VDD, the gate terminal thereof is connected to the first bias voltage terminal VB1 and the drain terminal thereof is connected to the source terminal of a P-channel transistor Tr124 with a channel length L2 and a channel width W1. The gate terminal of the transistor Tr124 is connected to the second bias voltage terminal VB2 and the drain terminal thereof is connected to the current output terminal Iout113. Thus, the current source 113 is able to output a current with a current value corresponding to 4LSB.

FIG. 15 is a layout diagram of the current sources 111 through 113 of FIG. 14. In general, the layout is realized by sharing a diffusion layer by a drain terminal of a transistor with a channel length L1 and a channel width W1 and a source terminal of a transistor with a channel length L2 and a channel width W1.

FIG. 16 is a diagram for showing arrangement of basic circuit blocks in a D/A converter having the current sources of FIG. 14. A circuit block 114 is a transistor matrix part composed of one 1LSB current source 111, one 2LSB current source 112 and sixty-three 4LSB current sources 113. In general, for reducing fabrication variation, the current sources are regularly arranged in the form of a complete matrix by also using dummy current sources so as not to make a gap.

Furthermore, a circuit block 115 is a switch block, where the switches SW1, SW2 and SW3-1 through SW3-63 of FIG. 13 are arranged.

Moreover, a circuit block 116 is a logic circuit including a decoder and the like.

FIG. 17 shows a second exemplified circuit configuration of the conventional current sources.

First, in a current source 119, the source terminal of a P-channel transistor Tr129 with a channel length L3 and a channel width W3 is connected to a power supply VDD, the gate terminal thereof is connected to a first bias voltage terminal VB1 and the drain terminal thereof is connected to the source terminal of a P-channel transistor Tr130 with a channel length L4 and a channel width W3, and the gate terminal of the transistor Tr130 is connected to a second bias voltage terminal VB2 and the drain terminal thereof is connected to a current output terminal Iout119. Thus, the current source 119 is able to output a current with a current value corresponding to 4LSB.

Next, in a current source 118, the source terminal of a P-channel transistor Tr127 with a channel length L3x2 and a channel width W3 is connected to a power supply VDD, the gate terminal thereof is connected to a first bias voltage terminal VB1 and the drain terminal thereof is connected to the source terminal of a P-channel transistor Tr128 with a channel length L4x2 and a channel width W3, and the gate terminal of the transistor Tr128 is connected to a second bias voltage terminal VB2 and the drain terminal thereof is connected to a current output terminal Iout118. Thus, the current source 118 is able to output a current corresponding to a half of the output of the current source 119, namely, a current with a current value corresponding to 2LSB.

Furthermore, in a current source 117, the source terminal of a P-channel transistor Tr125 with a channel length L3x4 and a channel width W3 is connected to a power supply VDD, the gate terminal thereof is connected to a first bias voltage terminal VB1 and the drain terminal thereof is connected to the source terminal of a P-channel transistor Tr126 with a channel length L4x4 and a channel width W3, and the gate terminal of the transistor Tr126 is connected to a second bias voltage terminal VB2 and the drain terminal thereof is connected to a current output terminal Iout117. Thus, the current source 117 is able to output a current corresponding to ¼ of the output of the current source 119, namely, a current with a current value corresponding to 1LSB.

FIG. 18 is a layout diagram of the current sources 117 through 119 of FIG. 17.

FIG. 19 shows a third exemplified circuit configuration of the conventional current sources, which is disclosed in Patent Document 1.

First, in a current source 122, the source terminal of a P-channel transistor Tr137 with a channel length L3, a channel width W3 and multiplier M of 1 is connected to a power supply VDD, the gate terminal thereof is connected to a first bias voltage terminal VB1 and the drain terminal thereof is connected to the source terminal of a P-channel transistor Tr138 with a channel length L4, a channel width W4 and multiplier M of 1, and the gate terminal of the transistor Tr138 is connected to a second bias voltage terminal VB2 and the drain terminal thereof is connected to a current output terminal Iout122. Thus, the current source 122 is able to output a current with a current value corresponding to 4LSB.

Next, in a current source 121, the source terminal of a P-channel transistor Tr134 with a channel length L3, a channel width W3 and multiplier M of 1 is connected to a power supply VDD, the gate terminal thereof is connected to a first bias voltage terminal VB1 and the drain terminal thereof is connected to the source terminal of a P-channel transistor Tr135 with a channel length L4x2, a channel width W4 and multiplier M of 1 and to the source terminal of a P-channel transistor Tr136 with a channel length L4x2, a channel width W4 and multiplier M of 1, and the gate terminals of the transistors Tr135 and Tr136 are connected to a second bias voltage terminal VB2, the drain terminal of the transistor Tr135 is connected to a current output terminal Iout121, the drain terminal of the transistor Tr136 is connected to the source terminal of a P-channel transistor Tr140 working as a load, and the gate terminal and the drain terminal of the transistor Tr140 are connected to a ground power supply VSS. A 4SLB current passes through the transistor Tr134, and a part of the current corresponding to 2SLB out of the 4SLB current flows to the ground power supply VSS through the transistors Tr136 and Tr140 and the remaining part of the current corresponding to 2LSB is output from the current output terminal Iout121.

Furthermore, in a current source 120, the source terminal of a P-channel transistor Tr131 with a channel length L3, a channel width W3 and multiplier M of 1 is connected to a power supply VDD, the gate terminal thereof is connected to a first bias voltage terminal VB1 and the drain terminal thereof is connected to the source terminal of a P-channel transistor Tr132 with a channel length L4x4, a channel width W4 and multiplier M of 1 and to the source terminal of a P-channel transistor Tr133 with a channel length L4x4, a channel width W4 and multiplier M of 3, and the gate terminals of the transistors Tr132 and Tr133 are connected to a second bias voltage terminal VB2, the drain terminal of the transistor Tr132 is connected to a current output terminal Iout120, the drain terminal of the transistor Tr133 is connected to the source terminal of a P-channel transistor Tr139 working as a load, and the gate terminal and the drain terminal of the transistor Tr139 are connected to a ground power supply VSS. A 4SLB current passes through the transistor Tr131, and a part of the current corresponding to 3SLB out of the 4SLB current flows to the ground power supply VSS through the transistors Tr133 and Tr139 and the remaining part of the current corresponding to 1LSB is output from the current output terminal Iout120.

Patent Document 1: U.S. Pat. No. 6,281,825

DISCLOSURE OF THE INVENTION

Problems to be Solved by the Invention

However, in the first conventional technique (shown in FIG. 14), each of the 4LSB current sources 113, which are as many as sixty-three in number, includes eight transistors, and therefore, the total number of transistors used in the current source matrix 114 is at least 510 (=(1+2×1+4×63)×2). Since the total number of transistors used in the current sources is thus large, the circuit area occupied by the current sources is large and the cost is disadvantageously increased. In addition, on a plane of the matrix with a large area where such a large number of transistors are disposed, the current characteristics of the respective transistors included in the current sources cannot be made uniform but in-plane inclination, that is, gradual increase of a difference in the current characteristic among the transistors (a systematic error), is increased. Therefore, the uniformity among the current sources is lowered, resulting in degrading the linearity of the conversion characteristic of the D/A converter.

Furthermore, in the second conventional technique (shown in FIG. 17), the size (the length L) of the transistor is different among the three kinds of current sources, that is, the 1LSB current source 117, the 2LSB current source 118 and the 4LSB current source 119 as shown in FIG. 18, and hence, transistor matrixes of the 1LSB current source 117 and the 2LSB current source 118 should be formed separately from the sixty-three 4LSB current sources 119. Therefore, the circuit area of the current sources is large. In addition, owing to a difference between the 4LSB current source 119 and the 1LSB and 2LSB current sources 117 and 118 in the processing accuracy, voltage drop on a power supply line, and owing to the in-plane inclination of the current characteristic of the transistors, a current value of each current source is shifted from an expected value, which disadvantageously degrades the linearity of the conversion characteristic of the D/A converter.

Moreover, in the third conventional technique (shown in FIG. 19), the internal configuration and the size (the length L) of the transistor are different among the three kinds of current sources 120, 121 and 122 in the same manner as in the second conventional technique. Therefore, it is necessary to form the transistor matrixes of the 1LSB current source 120 and the 2LSB current source 121 separately from the sixty-three 4LSB current sources 122, and hence, the area occupied by the current sources is increased. In addition, owing to a difference between the 4LSB current source (transistor matrix) 122 and the 1LSB and 2LSB current sources 120 and 121 in the processing accuracy, voltage drop on a power supply line, and owing to the in-plane inclination of the current characteristic of the transistors, a current value of each current source is shifted from an expected value, which disadvantageously degrades the linearity of the conversion characteristic of the D/A converter.

An object of the invention is, in a current steering D/A converter, improving the linearity of the D/A conversion characteristic by attaining uniformity in the current characteristic among transistors on a plane of a transistor matrix while effectively reducing the circuit area occupied by all current sources included therein.

Means for Solving the Problems

In order to achieve the object, the present invention provides binary code current sources for outputting currents of which each adjacent pair of current values are weighted by ½, wherein transistors of each binary code current source, each of which has the same size as transistors of a thermometer code current source, are serially cascode-connected and gate terminals of the transistors are connected in common. Thus, all current sources can be configured by combining transistors of the same size, so that the transistors of all the current sources can be formed in transistor matrixes.

Specifically, the D/A converter of this invention for converting a digital signal into an analog signal includes a plurality of current sources, the plurality of current sources include a current source composed of a first circuit and a second circuit cascade-connected to each other, the first circuit includes cascade-connection of m (wherein m is an integer not less than 2) field effect transistors having a first size with a first bias voltage commonly applied to gate terminals of the m field effect transistors, and the second circuit includes cascade-connection of m field effect transistors having a second size with a second bias voltage commonly applied to gate terminals of the m field effect transistors.

In the D/A converter of this invention, each of the field effect transistors having the first size and the field effect transistors having the second size is a MOS transistor.

In the D/A converter of the invention, the MOS transistor is a P-channel MOS transistor.

In the D/A converter of the invention, the MOS transistor is an N-channel MOS transistor.

In the D/A converter of the invention, the current source composed of the first circuit and the second circuit cascade-connected to each other is one or more in number, and the one or more current sources are binary code current sources for outputting currents with current values weighted by ½.

In the D/A converter of the invention, the field effect transistors having the first size are formed within a first transistor matrix, and the field effect transistors having the second size are formed within a second transistor matrix.

In the D/A converter of the invention, each of the first transistor matrix and the second transistor matrix includes dummy transistors provided in the periphery.

In the D/A converter of the invention, a gate terminal of a given transistor formed within the first transistor matrix is connected to a drain terminal of a given transistor formed within the second transistor matrix, and a voltage generated on a connecting point of the two given transistors is the first bias voltage.

In the D/A converter of the invention, the first or second transistor matrix includes a pattern in which a diffusion layer is shared by source terminals of given two P-channel transistors; and a pattern in which a diffusion layer is shared by a drain terminal of one P-channel transistor and a source terminal of another P-channel transistor.

The D/A converter of this invention for converting a set of digital signals into an analog signal includes a plurality of current sources, the plurality of current sources include a current source composed of a first circuit and a second circuit cascade-connected to each other, the first circuit includes cascade-connection of m (wherein m is an integer not less than 1) field effect transistors having a first size with a first bias voltage commonly applied to gate terminals of the m field effect transistors, and the second circuit includes cascode-connection of n (wherein n≧2 and n≠m) field effect transistors having a second size with a second bias voltage commonly applied to gate terminals of the n field effect transistors.

In the D/A converter of the invention, the field effect transistors having the first size are formed within a first transistor matrix, and the field effect transistors having the second size are formed within a second transistor matrix.

The D/A converter of this invention for converting a set of digital signals into an analog signal includes a plurality of current sources, the plurality of current sources include a current source composed of a first circuit and a second circuit cascade-connected to each other, the first circuit includes m (wherein m is an integer not less than 2) field effect transistors having a first size and connected in parallel to one another with drain terminals thereof shared and with a first bias voltage commonly applied to gate terminals of the m field effect transistors, and the second circuit includes cascode-connection of n (wherein n≧2) field effect transistors having a second size with a second bias voltage commonly applied to gate terminals of the n field effect transistors.

In the D/A converter of this invention, the field effect transistors having the first size are formed within a first transistor matrix, and the field effect transistors having the second size are formed within a second transistor matrix.

The semiconductor integrated circuit of this invention includes any of the aforementioned D/A converters of this invention.

As described above, according to the present invention, each of all current sources can be constructed by combining transistors with the same size no matter whether the current source is disposed in lower bits or in higher bits, and therefore, transistors of all the current sources can be formed in transistor matrixes. Accordingly, differently from the conventional technique in which transistors included in a given current source should be formed outside a transistor matrix, differences, between a current source formed in a transistor matrix and a current source disposed outside the matrix, in the processing accuracy and the voltage drop on power supply lines can be avoided. Therefore, current values of the respective current sources are not shifted from expected values, so as to attain good linearity of the conversion characteristic of the D/A converter.

In addition, for example, one current value determining transistor is used in a current source disposed in a higher bit portion, and a plurality of current value determining transistors with the same size cascode-connected in series are used with a gate voltage shared in lower bit current sources. Thus, a plurality of current sources for outputting binary codes weighted by ½ can be obtained. Accordingly, a plurality of higher bit current sources designed with a thermometer code can be formed by using a small number of transistors, resulting in effectively reducing the area of a transistor matrix. Therefore, fabrication variation such as inclination of the current characteristic of all the transistors on a plane of the transistor matrix can be effectively suppressed, so that the linearity of the conversion characteristic of the D/A converter can be further improved.

Effect of the Invention

As described so far, according to the present invention, a D/A converter in which the linearity of the D/A conversion characteristic is further improved by attaining uniformity of the current characteristic among all transistors on a plane of a transistor matrix while effectively reducing the circuit area of all current sources included therein, and a semiconductor integrated circuit including the same can be obtained.

DESCRIPTION OF REFERENCE NUMERALS

Figure 1:
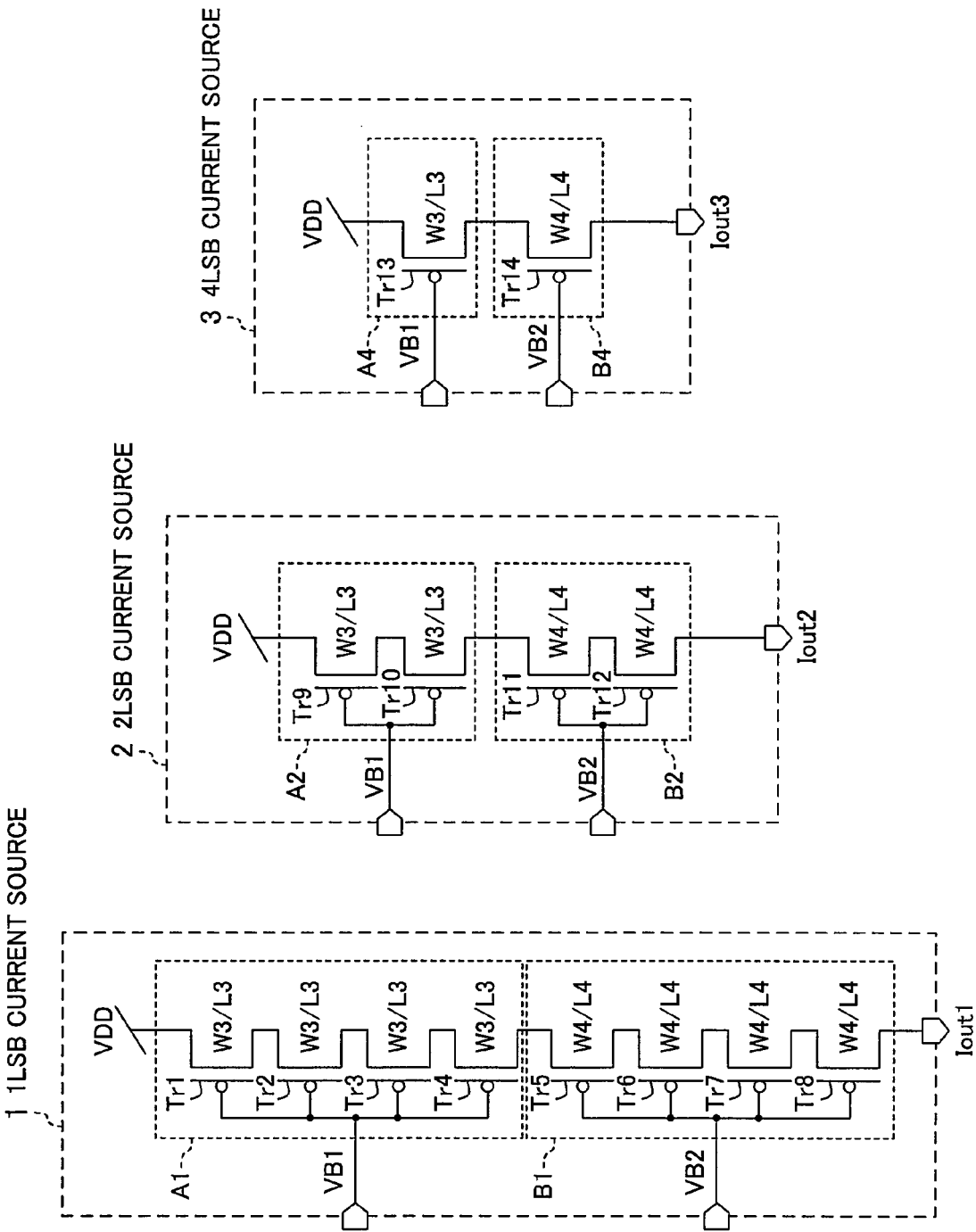
FIG. 1 is a circuit diagram of current sources included in a D/A converter according to Embodiment 1 of the invention.

100 D/A converter
101 output load resistor
102 external resistor
103 reference voltage generator circuit
104 bias circuit
105 decoder circuit
VB1 first bias voltage terminal
VB2 second bias voltage terminal
IS1, IS2, IS3-1 through IS3-63 current source
IN0 through IN7 digital input terminal
SW1, SW2, SW3-1 through 63 differential switch
D1, D2, D3-1 through 63 differential switch control signal
OUT analog output terminal
VSS ground power supply
1, 12, 20, 20', 23, 23', 29, 111, 117, 120 1LSB current source
2, 13, 21, 21', 24, 24', 30, 112, 118, 121 2LSB current source
3, 14, 18, 22, 22', 25, 25', 31, 113, 119, 122 4LSB current source
A1, A2, A4, C1, C2, C4 first circuit
B1, B2, B4, D1, D2, D4 second circuit
4, 16 first MOS transistor matrix
5, 17 second MOS transistor matrix
6, 115 switch circuit
7, 116 logic circuit
114 transistor matrix
8, 9 dummy MOS transistor
15 bias circuit
Iout1 through Iout3, Iout12 through Iout14, Iout15, Iout18, Iout19, Iout20 through Iout22, Iout23 through Iout25, Iout29, through Iout31, Iout111 through Iout113, Iout117 through Iout119, Iout120 through Iout122 current output terminal

BEST MODE FOR CARRYING OUT THE INVENTION

D/A converters according to preferred embodiments of the invention will now be described with reference to the accompanying drawings.

Embodiment 1

Figure 13:
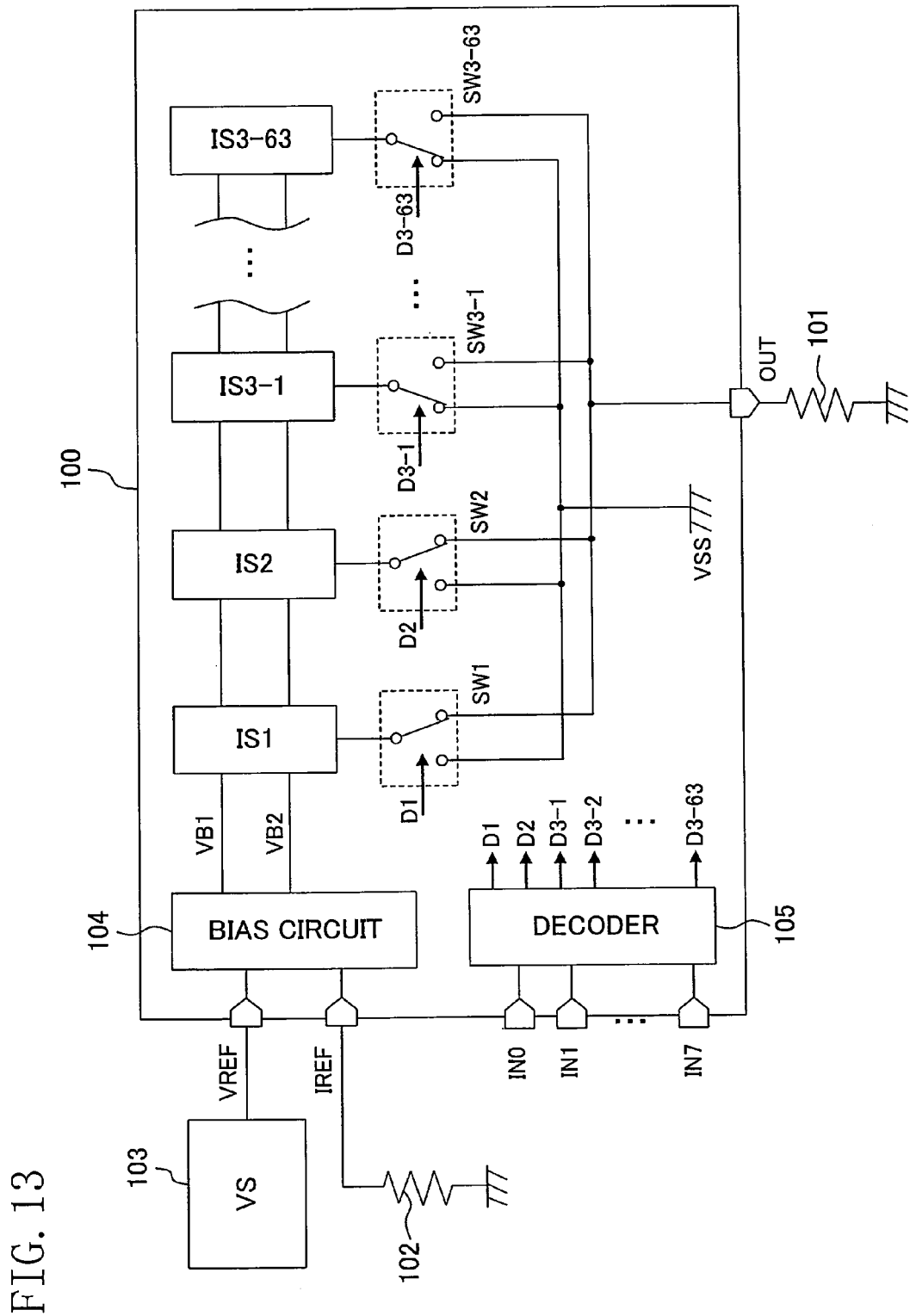
FIG. 13 is a diagram for showing the whole architecture of a conventional D/A converter.

FIG. 1 shows the circuit configurations of current sources included in a D/A converter according to Embodiment 1 of the invention. The whole architecture of the D/A converter is shown in FIG. 13, which has been already described and hence herein omitted.

A current source 1 is a 1LSB current source, a current source 2 is a 2LSB current source and a current source 3 is a 4LSB current source. A current value of a current supplied from the 2LSB current source 2 is weighted to be ½ of a current supplied from the 4LSB current source 3, and a current value of a current supplied from the 1LSB current source 1 is weighted to be ½ of the current supplied from the 2LSB current source 2. The current source 1 and the current source 2 are binary code current sources for outputting currents with current values weighted by ½.

The 4LSB current source 3 includes cascade-connection of a first circuit 4A composed of one (namely, m=1) P-channel MOS transistor Tr13 and a second circuit B4 composed of another (namely, m=1) P-channel MOS transistor (i.e., field effect transistor) Tr14. In this current source 3, the source terminal of the P-channel MOS transistor Tr13 with a channel length L3 and a channel width W3 (corresponding to a first size) is connected to a power supply VDD, the gate terminal thereof is connected to a first bias voltage terminal VB1 and the drain terminal thereof is connected to the source terminal of the P-channel MOS transistor Tr14 with a channel length L4 and a channel width W4 (corresponding to a second size). The gate terminal of the MOS transistor Tr14 is connected to a second bias voltage terminal VB2 and the drain terminal thereof is connected to a current output terminal Iout3. Thus, a 4LSB current is output from the current output terminal Iout3.

The 2LSB current source 2 includes cascade-connection of a first circuit A2 composed of cascode-connected two (namely, m=2) P-channel MOS transistors Tr9 and Tr10 and a second circuit B2 composed of cascode-connected other two (namely, m=2) P-channel MOS transistors Tr11 and Tr12. In this 2LSB current source 2, the source terminal of the P-channel MOS transistor Tr9 with a channel length L3 and a channel width W3 is connected to a power supply VDD, the gate terminal thereof is connected to a first bias voltage terminal VB1 and the drain terminal thereof is connected to the source terminal of the P-channel MOS transistor Tr10 with a channel length L3 and a channel width W3. The gate terminal of the MOS transistor Tr10 is connected to the first bias voltage terminal VB1 and the drain terminal thereof is connected to the source terminal of the P-channel MOS transistor Tr11 with a channel length L4 and a channel width W4, and the gate terminal of the MOS transistor Tr11 is connected to a second bias voltage terminal VB2 and the drain terminal thereof is connected to the source terminal of the P-channel MOS transistor Tr12 with a channel length L4 and a channel width W4. The gate terminal of the MOS transistor Tr12 is connected to the second bias voltage terminal VB2 and the drain terminal thereof is connected to a current output terminal Iout2. Thus, a current with a current value corresponding to a half of the output of the current source 3, namely, a 2LSB current, is output from the current output terminal Iout2.

The 1LSB current source 1 includes cascade-connection of a first circuit A1 composed of cascode-connected four (namely, m=4) P-channel MOS transistors Tr1 through Tr4 and a second circuit B1 composed of cascode-connected other four (namely, m=4) P-channel MOS transistors Tr5 through Tr8. In this current source 1, the source terminal of the P-channel MOS transistor Tr1 with a channel length L3 and a channel width W3 is connected to a power supply VDD, the gate terminal thereof is connected to a first bias voltage terminal VB1 and the drain terminal thereof is connected to the source terminal of the P-channel MOS transistor Tr2 with a channel length L3 and a channel width W3. The gate terminal of the MOS transistor Tr2 is connected to the first bias voltage terminal VB1, the drain terminal thereof is connected to the source terminal of the P-channel MOS transistor Tr3 with a channel length L3 and a channel width W3, and the gate terminal of the MOS transistor Tr3 is connected to the first bias voltage terminal VB1 and the drain terminal thereof is connected to the source terminal of the P-channel MOS transistor Tr4 with a channel length L3 and a channel width W3. The gate terminal of the MOS transistor Tr4 is connected to the first bias voltage terminal VB1 and the drain terminal thereof is connected to the source terminal of the P-channel MOS transistor Tr5 with a channel length L4 and a channel width W4, and the gate terminal of the MOS transistor Tr5 is connected to the second bias voltage terminal VB2 and the drain terminal thereof is connected to the source terminal of the P-channel MOS transistor Tr6 with a channel length L4 and a channel width W4. The gate terminal of the MOS transistor Tr6 is connected to the second bias voltage terminal VB2 and the drain terminal thereof is connected to the source terminal of the P-channel MOS transistor Tr7 with a channel length L4 and a channel width W4, and the gate terminal of the MOS transistor Tr7 is connected to the second bias voltage terminal VB2 and the drain terminal thereof is connected to the source terminal of the P-channel MOS transistor Tr8 with a channel length L4 and a channel width W4. The gate terminal of the MOS transistor Tr8 is connected to the second bias voltage terminal VB2 and the drain terminal thereof is connected to a current output terminal Iout1. Thus, a current with a current value corresponding to ¼ of the output of the current source 3, namely, a 1LSB current, is output from the current output terminal Iout1.

Figure 2:
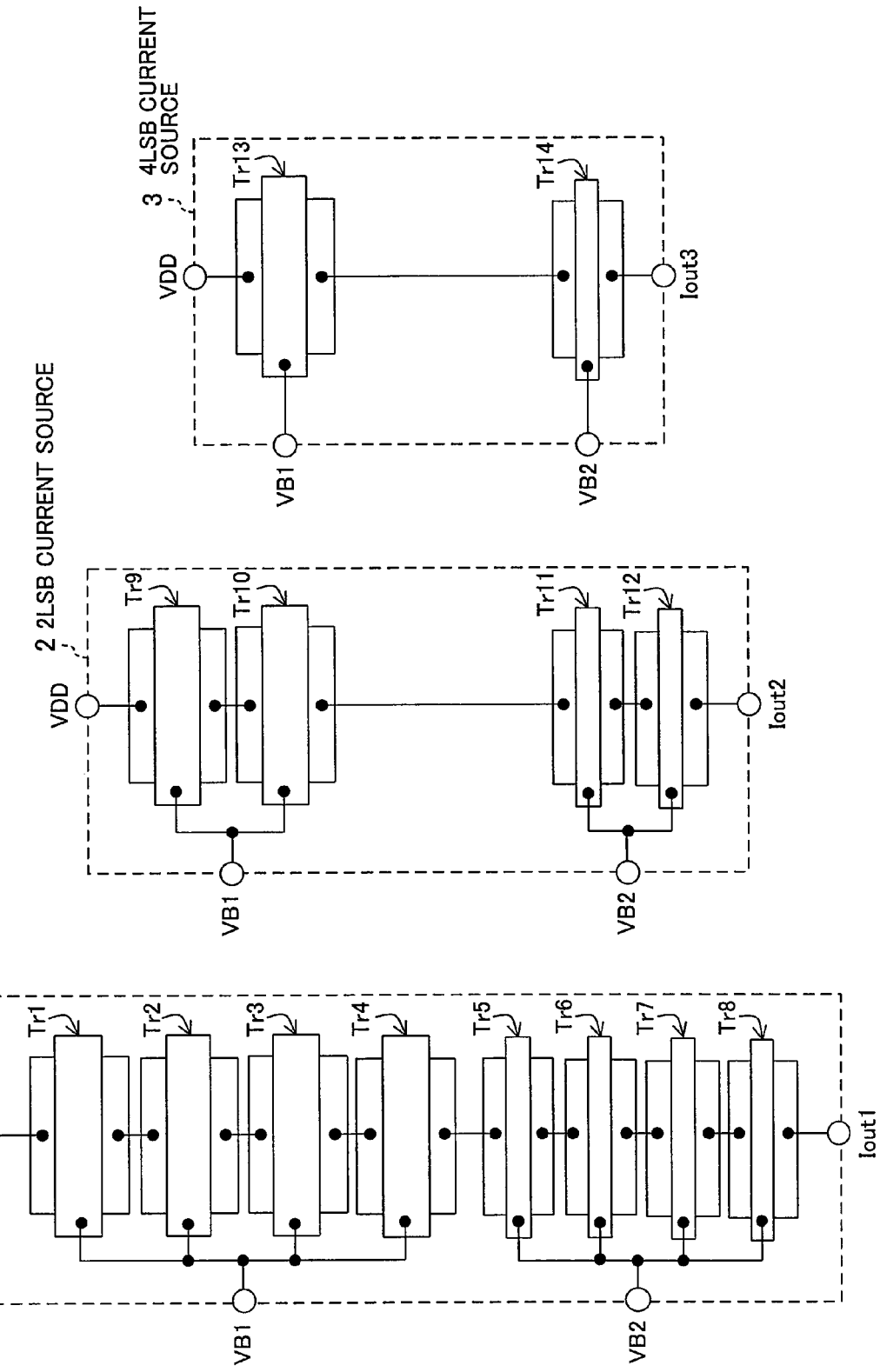
FIG. 2 is a diagram for showing the layout of the current sources.

FIG. 2 is a layout diagram of the current sources of FIG. 1, in which the current sources 1 through 3 shown in FIG. 1 are respectively realized.

Figure 3:
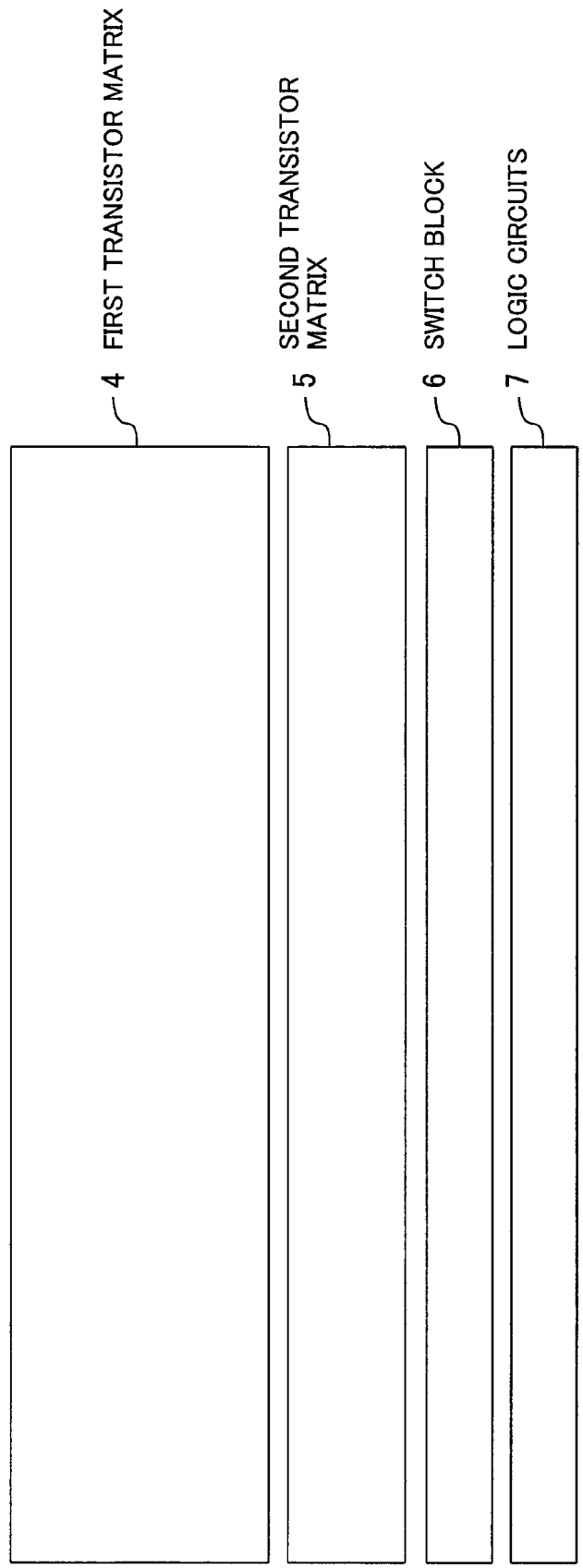
FIG. 3 is a diagram for showing block arrangement in the D/A converter.

Furthermore, FIG. 3 is a diagram for showing the arrangement of basic circuit blocks in the D/A converter of this embodiment. In FIG. 3, a circuit block 4 is a first MOS transistor matrix in which the MOS transistors included in the first circuits A1, A2 and A3 of FIG. 1, namely, a large number of P-channel MOS transistors having a size of the channel length L3 and the channel width W3, are formed. The first circuits A1, A2 and A3 including the MOS transistors formed in the first MOS transistor matrix 4 respectively determine the current values of the currents supplied by the corresponding current sources 1, 2 and 3. On the other hand, a circuit block 5 is a second MOS transistor matrix in which the MOS transistors included in the second circuits B1, B2 and B3 of FIG. 1, namely, a large number of P-channel MOS transistors having a size of the channel length L4 and the channel width W4, are formed. The second circuits B1, B2 and B3 including the MOS transistors formed in the second MOS transistor matrix 5 are provided in order to respectively set high output impedance of the corresponding current sources 1, 2 and 3 for attaining a good constant current characteristic.

Furthermore, a circuit block 6 of FIG. 3 is a switch block, in which the switches SW1, SW2 and SW3-1 through SW3-63 shown in FIG. 13 are disposed. Moreover, a circuit block 7 is a block of logic circuits such as a decoder.

In the current sources 1 through 3 of FIG. 1, the P-channel MOS transistors having the size of the channel length L3 and the channel width W3 are disposed in a region corresponding to the circuit block 4 and the P-channel MOS transistors having the size of the channel length L4 and the channel width W4 are disposed in a region corresponding to the circuit block 5.

In each of the circuit blocks 4 and 5, the MOS transistors including dummy MOS transistors are regularly arranged in the form of a complete matrix so as not to make any gap. Therefore, they have an advantage that size variation derived from process accuracy in the fabrication is reduced so as to form the MOS transistors with uniform characteristics.

Figure 14:
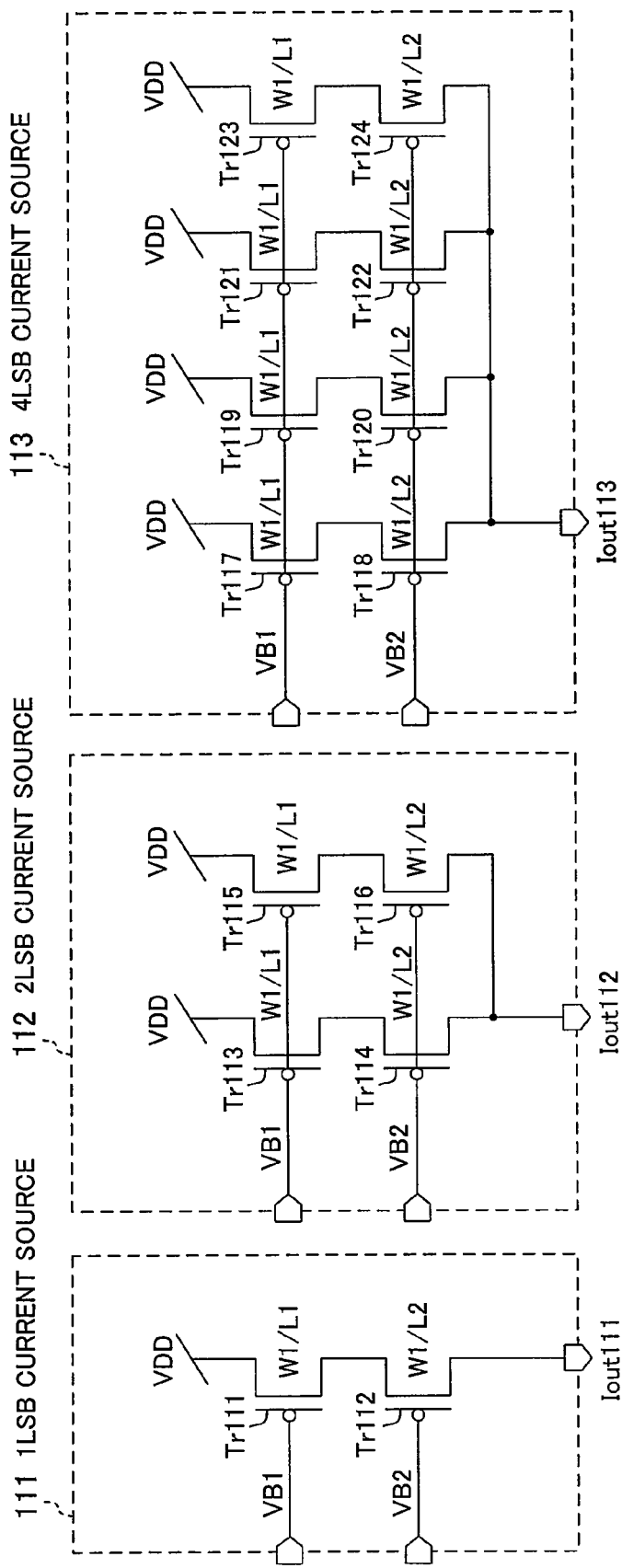
FIG. 14 is a circuit diagram of current sources included in a D/A converter according to first conventional technique.
Figure 15:
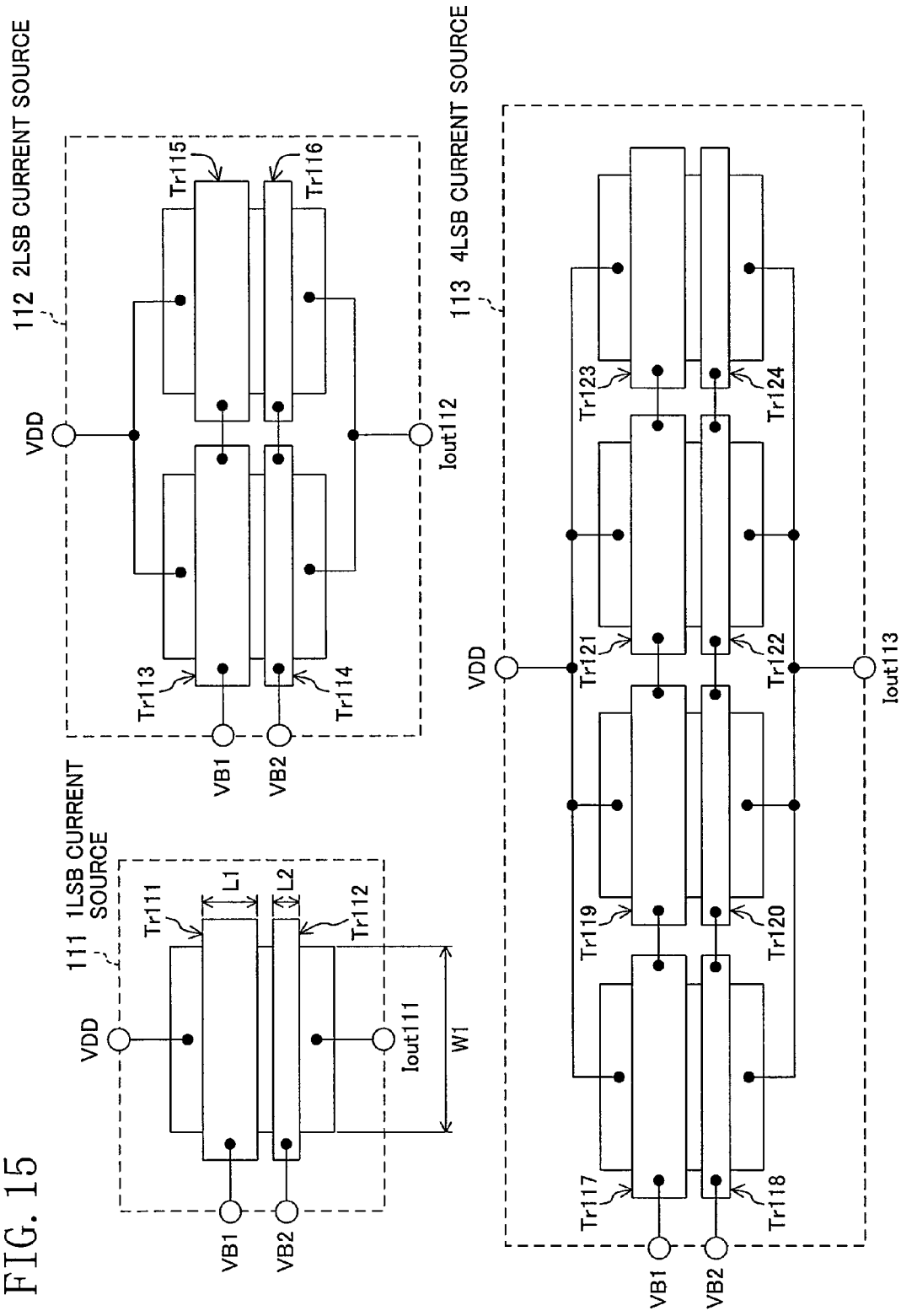
FIG. 15 is a diagram for showing the layout of the current sources.
Figure 16:
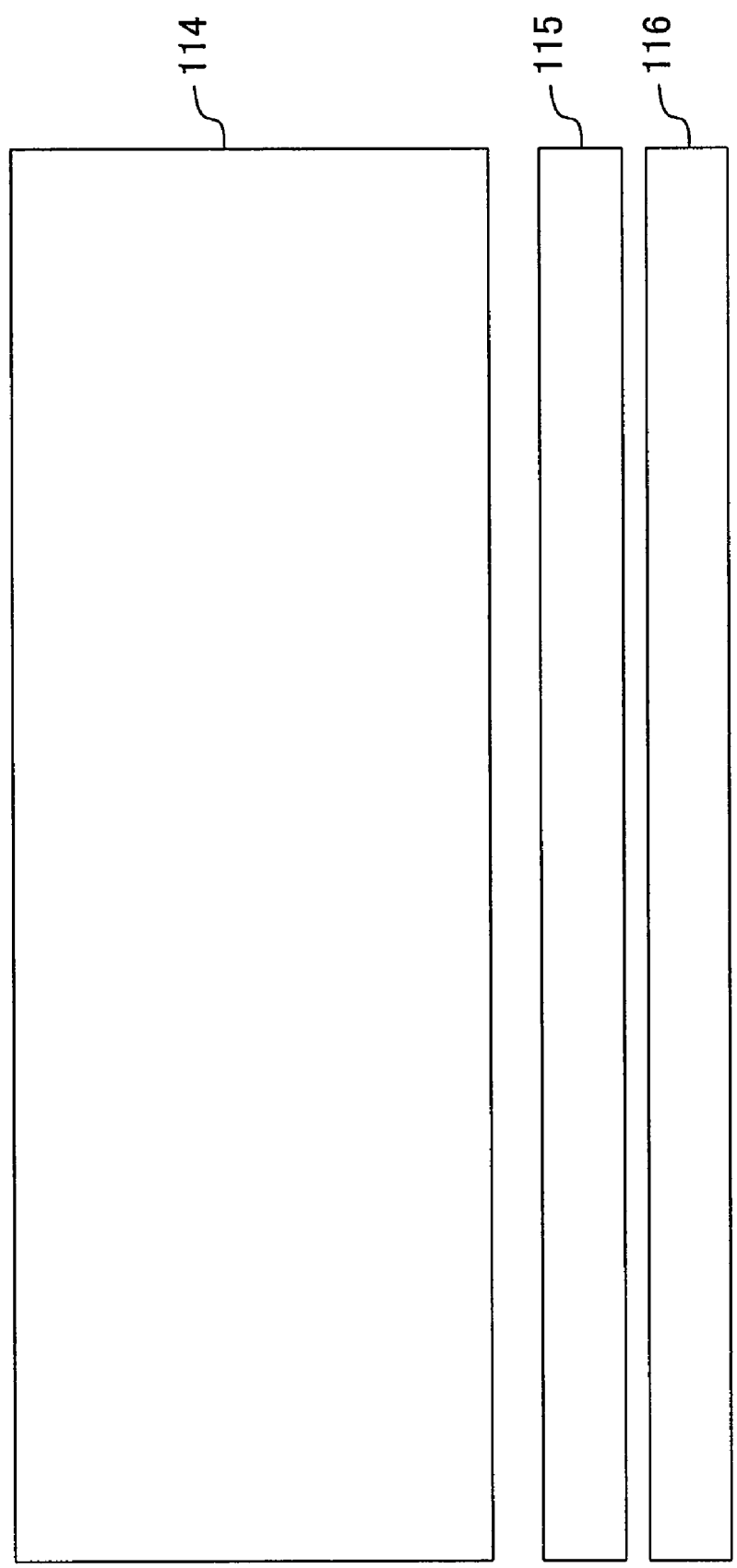
FIG. 16 is a diagram for showing block arrangement in the D/A converter.
Figure 17:
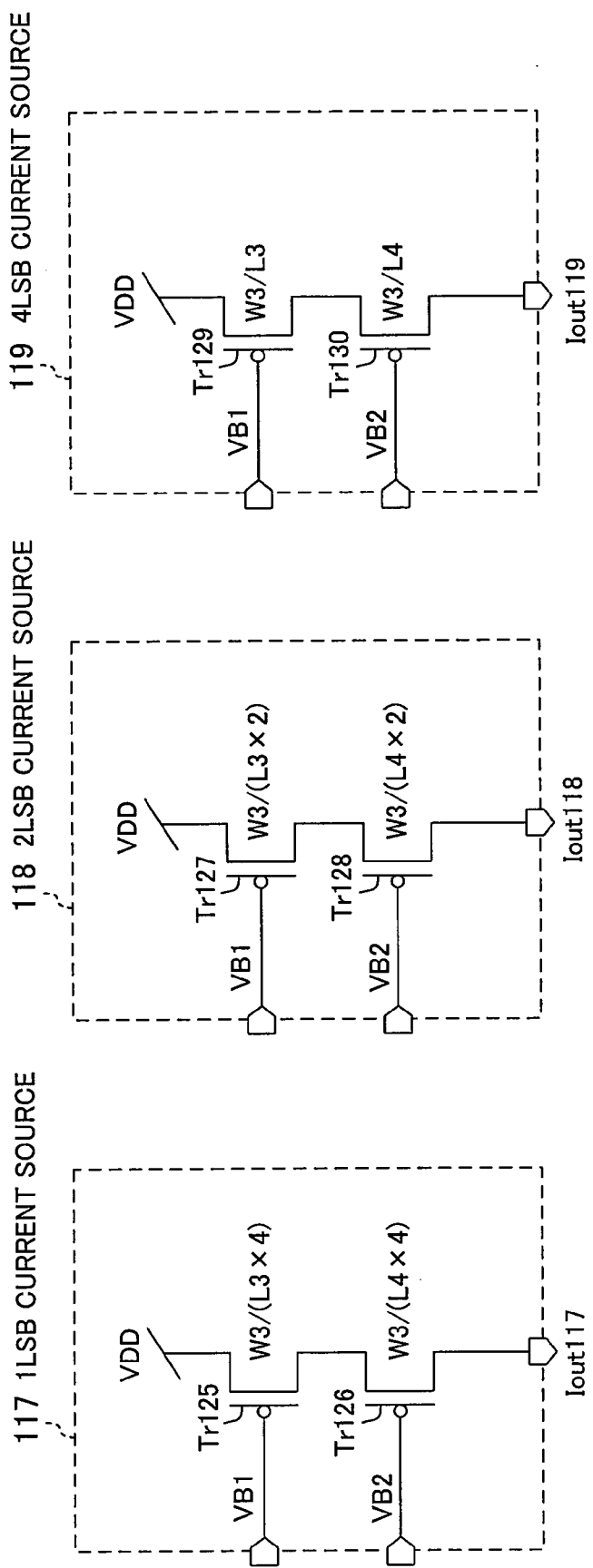
FIG. 17 is a circuit diagram of current sources included in a D/A converter according to second conventional technique.
Figure 18:
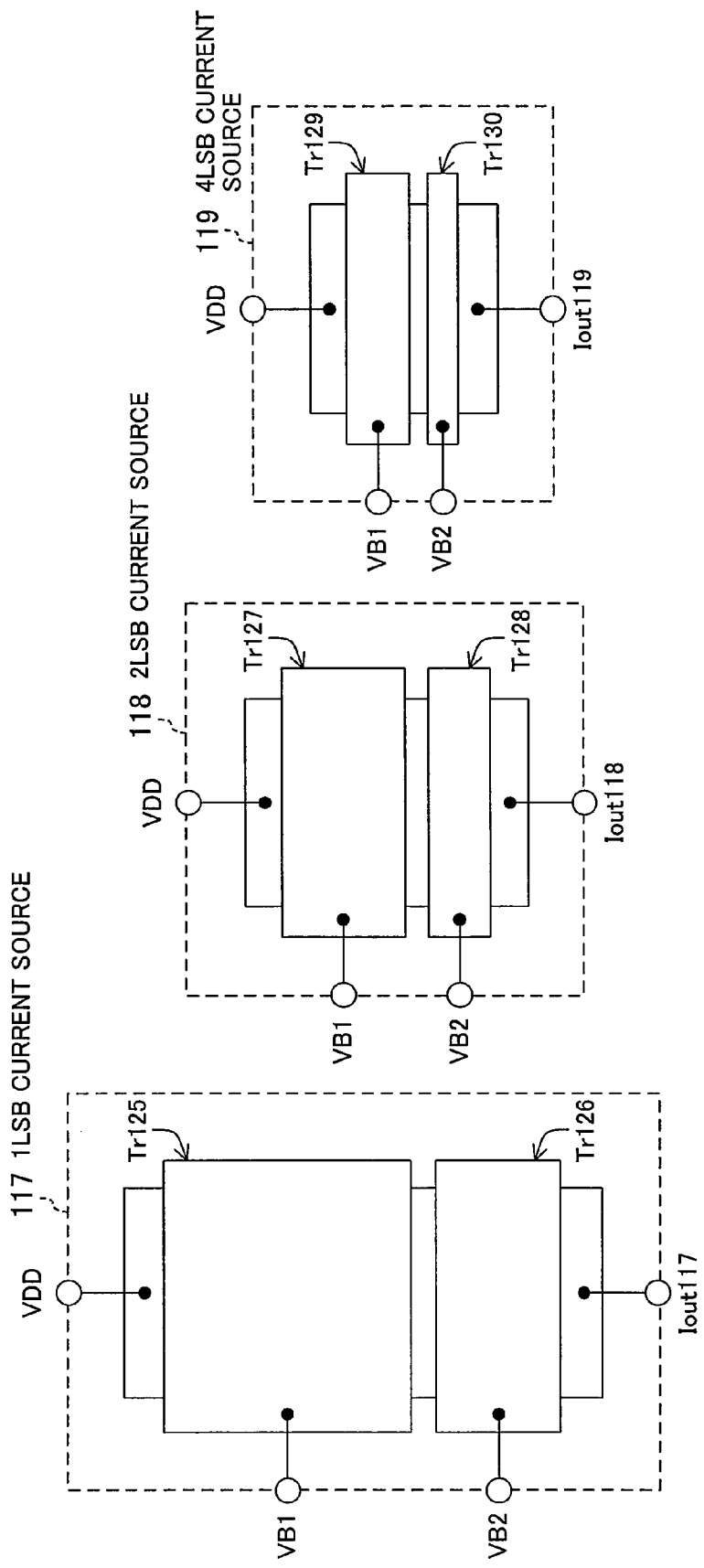
FIG. 18 is a diagram for showing the layout of the current sources.
Figure 19:
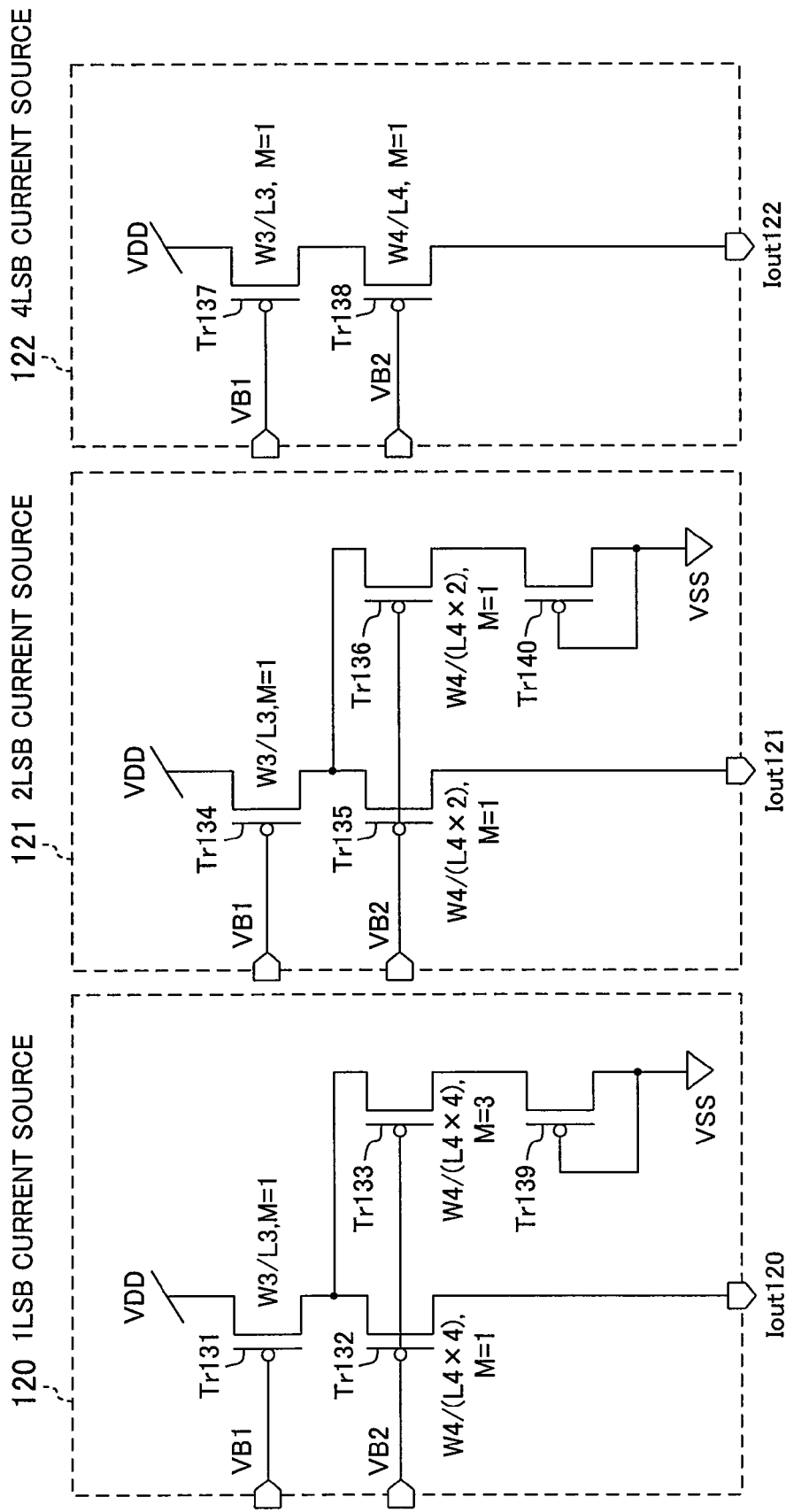
FIG. 19 is a circuit diagram of current sources included in a D/A converter according to third conventional technique.

Furthermore, in this embodiment, MOS transistors of which size is different from the first size of the channel length L3 and the channel width W3 and the second size of the channel length L4 and the channel width W4 are not necessary for the current sources. In addition, since each of the sixty-three 4LSB current sources 3 is composed of the two MOS transistors Tr13 and Tr14 alone, the total number of transistors included in all the sixty-five current sources provided in the D/A converter is 138 (=(4×1+2×1+1×63)×2), which is as small as ⅓ or less of the total number (i.e., 510) of transistors included in the current sources of the first conventional technique shown in FIG. 14. Accordingly, the circuit area of the whole current sources can be effectively reduced and the cost can be lowered.

Moreover, since the transistor matrixes 4 and 5 have small areas as described above, the in-plane inclination of the current characteristics of all the MOS transistors within each matrix can be reduced. Therefore, the uniformity among the current sources is improved, so as to attain good linearity of the conversion characteristic of the D/A converter.

Furthermore, the output current value of each current source is determined principally by the P-channel MOS transistors having the size of the channel length L3 and the channel width W3, and since the MOS transistors having the size of the channel length L3 and the channel width W3 are disposed in a smaller area in the arrangement of this embodiment, unevenness among the current sources derived from the in-plane distribution of the current characteristic of the MOS transistors can be reduced, so as to advantageously improve the linearity characteristic of the D/A converter.

In this manner, according to this embodiment, a current steering D/A converter including transistor matrixes that are small in the fabrication variation, are more uniform and have smaller areas can be realized.

Embodiment 2

Figure 4:
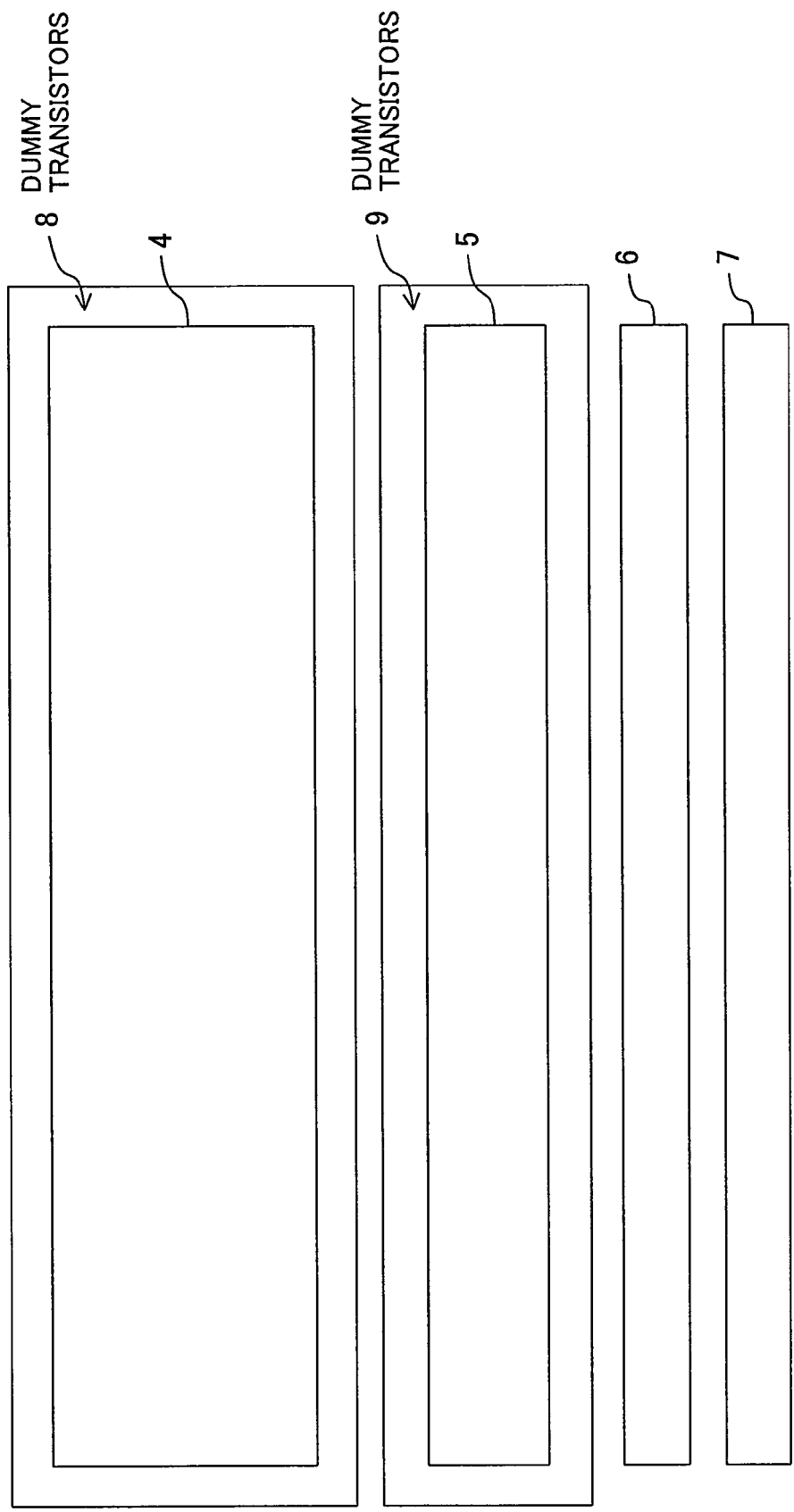
FIG. 4 is a diagram for showing block arrangement in a D/A converter according to Embodiment 2 of the invention.

FIG. 4 is a diagram for showing arrangement of blocks in a D/A converter according to Embodiment 2 of the invention.

In the block arrangement of FIG. 4, the variation in the D/A converter of Embodiment 1 is further reduced, and specifically, a large number of dummy MOS transistors 8 having a size of a channel length L3 and a channel width W3 are disposed around the circuit block 4 of FIG. 3 and a large number of dummy MOS transistors 9 having a size of a channel length L4 and a channel width W4 are similarly disposed around the circuit block 5 of FIG. 3.

In fabricating each of the circuit blocks (current source matrixes) 4 and 5, the fabrication variation is larger in its peripheral portion. However, when the dummy MOS transistors are disposed in the periphery as shown in FIG. 4, the fabrication variation of the general MOS transistors otherwise caused in the peripheral portions of the current source matrixes 4 and 5 can be reduced, resulting in further improving the uniformity of the current sources.

In this manner, according to this embodiment, a current steering D/A converter including further uniform transistor matrixes can be realized.

Embodiment 3

Figure 5:
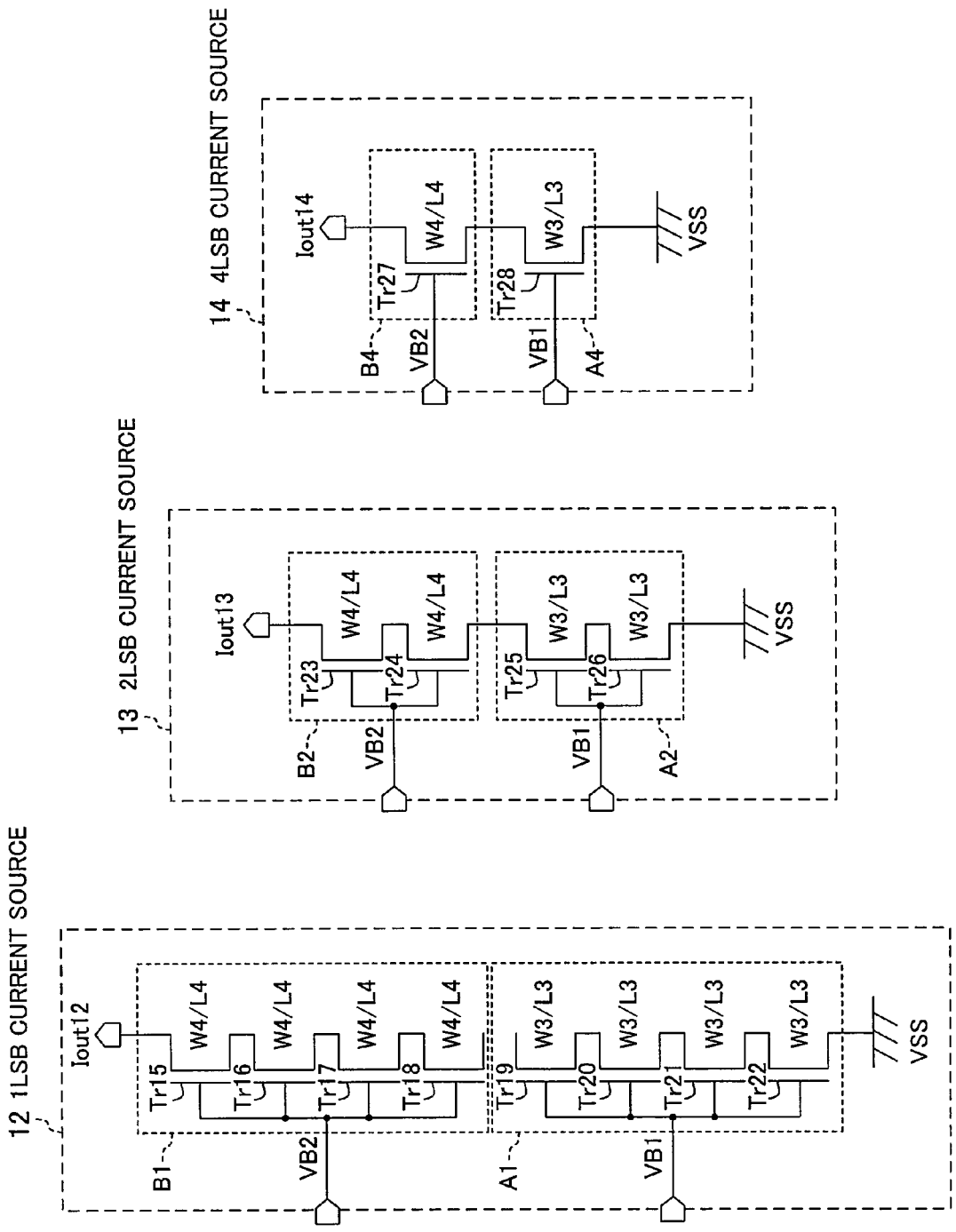
FIG. 5 is a circuit diagram of current sources included in a D/A converter according to Embodiment 3 of the invention.

FIG. 5 shows the circuit configurations of current sources included in a D/A converter according to Embodiment 3 of the invention. In this embodiment, the current sources of Embodiment 1 shown in FIG. 1 are constructed by using N-channel MOS transistors.

In FIG. 5, a current source 12 is a 1LSB current source, a current source 13 is a 2LSB current source and a current source 14 is a 4LSB current source.

The 4LSB current source 14 includes cascade-connection of a first circuit 4A composed of one (namely, m=1) N-channel MOS transistor Tr28 and a second circuit B4 composed of another (namely, m=1) N-channel MOS transistor Tr27. In this current source 14, the source terminal of the N-channel MOS transistor Tr28 with a channel length L3 and a channel width W3 is connected to a ground power supply VSS, the gate terminal thereof is connected to a first bias voltage terminal VB1 and the drain terminal thereof is connected to the source terminal of the N-channel MOS transistor Tr27 with a channel length L4 and a channel width W4. The gate terminal of the MOS transistor Tr27 is connected to a second bias voltage terminal VB2 and the drain terminal thereof is connected to a current output terminal Iout14. Thus, a 4LSB current is drawn from the current output terminal Iout14.

The 2LSB current source 13 includes cascade-connection of a first circuit A2 composed of cascode-connected two (namely, m=2) N-channel MOS transistors Tr26 and Tr25 and a second circuit B2 composed of cascode-connected other two (namely, m=2) N-channel MOS transistors Tr24 and Tr23. In this current source 13, the source terminal of the N-channel MOS transistor Tr26 with a channel length L3 and a channel width W3 is connected to a ground power supply VSS, the gate terminal thereof is connected to a first bias voltage terminal VB1 and the drain terminal thereof is connected to the source terminal of the N-channel MOS transistor Tr25 with a channel length L3 and a channel width W3. The gate terminal of the MOS transistor Tr25 is connected to the first bias voltage terminal VB1 and the drain terminal thereof is connected to the source terminal of the N-channel MOS transistor Tr24 with a channel length L4 and a channel width W4, and the gate terminal of the MOS transistor Tr24 is connected to a second bias voltage terminal VB2 and the drain terminal thereof is connected to the source terminal of the N-channel MOS transistor Tr23 with a channel length L4 and a channel width W4. The gate terminal of the MOS transistor Tr23 is connected to the second bias voltage terminal VB2 and the drain terminal thereof is connected to a current output terminal Iout13. Thus, a current with a current value corresponding to a half of the output of the current source 14, namely, a 2LSB current, is drawn from the current output terminal Iout13.

The 1LSB current source 12 includes cascade-connection of a first circuit A1 composed of cascode-connected four (namely, m=4) N-channel MOS transistors Tr22 through Tr19 and a second circuit B1 composed of cascode-connected other four (namely, m=4) N-channel MOS transistors Tr18 through Tr15. In this current source 12, the source terminal of the N-channel MOS transistor Tr22 with a channel length L3 and a channel width W3 is connected to a ground power supply VSS, the gate terminal thereof is connected to a first bias voltage terminal VB1 and the drain terminal thereof is connected to the source terminal of the N-channel MOS transistor Tr21 with a channel length L3 and a channel width W3. The gate terminal of the MOS transistor Tr21 is connected to the first bias voltage terminal VB1 and the drain terminal thereof is connected to the source terminal of the N-channel MOS transistor Tr20 with a channel length L3 and a channel width W3, and the gate terminal of the MOS transistor Tr20 is connected to the first bias voltage terminal VB1 and the drain terminal thereof is connected to the source terminal of the N-channel MOS transistor Tr19 with a channel length L3 and a channel width W3. The gate terminal of the MOS transistor Tr19 is connected to the first bias voltage terminal VB1 and the drain terminal thereof is connected to the source terminal of the N-channel MOS transistor Tr18 with a channel length L4 and a channel width W4, and the gate terminal of the MOS transistor Tr18 is connected to a second bias voltage terminal VB2 and the drain terminal thereof is connected to the source terminal of the N-channel MOS transistor Tr17 with a channel length L4 and a channel width W4. The gate terminal of the MOS transistor Tr17 is connected to the second bias voltage terminal VB2 and the drain terminal thereof is connected to the source terminal of the N-channel MOS transistor Tr16 with a channel length L4 and a channel width W4, and the gate terminal of the MOS transistor Tr16 is connected to the second bias voltage terminal VB2 and the drain terminal thereof is connected to the source terminal of the N-channel MOS transistor Tr15 with a channel length L4 and a channel width W4. The gate terminal of the MOS transistor Tr15 is connected to the second bias voltage terminal VB2 and the drain terminal thereof is connected to a current output terminal Iout12. Thus, a current with a current value corresponding to ¼ of the output of the current source 14, namely, a 1LSB current, is drawn from the current output terminal Iout12.

In this embodiment, the transistors are regularly arranged in the form of a complete matrix so as not to make any gap in the matrix. Therefore, they have an advantage that size variation derived from process accuracy in the fabrication is reduced so as to form the MOS transistors with uniform characteristics.

Furthermore, in this embodiment, MOS transistors of which size is different from the first size of the channel length L3 and the channel width W3 and the second size of the channel length L4 and the channel width W4 are not necessary for the current sources. Therefore, the size of each transistor matrix can be advantageously suppressed to be small.

Furthermore, the output current value of each current source is determined principally by the N-channel MOS transistors having the size of the channel length L3 and the channel width W3, and since the MOS transistors having the size of the channel length L3 and the channel width W3 are disposed in a smaller area in the arrangement of this embodiment, unevenness among the current sources derived from the in-plane distribution of the current characteristic of the MOS transistors can be reduced, so as to advantageously improve the linearity characteristic of the D/A converter.

In this manner, according to this embodiment, a current steering D/A converter including transistor matrixes that are small in the fabrication variation, are more uniform and have smaller areas can be realized.

Embodiment 4

Figure 6:
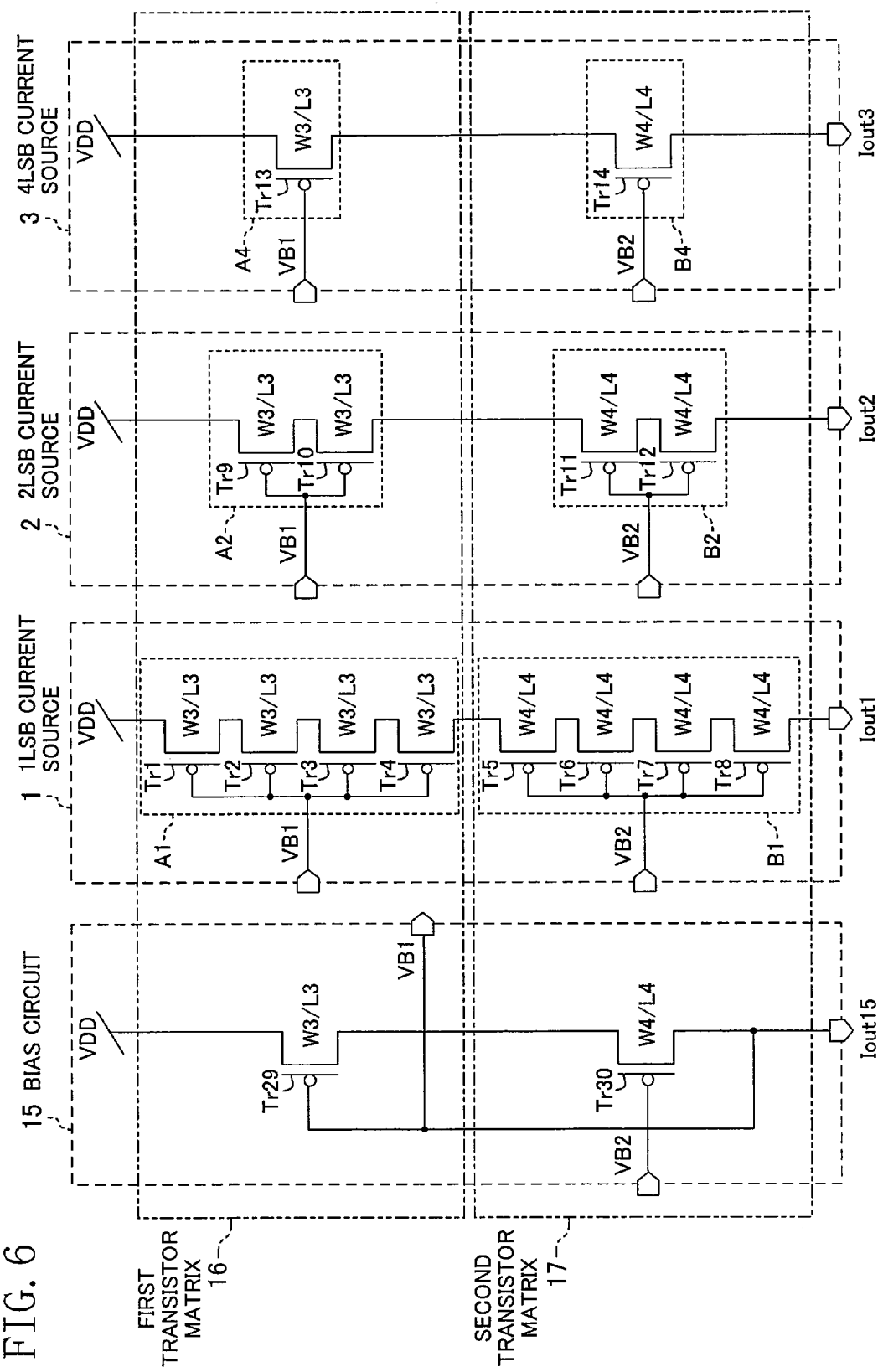
FIG. 6 is a circuit diagram of a principal part of a D/A converter according to Embodiment 4 of the invention.

FIG. 6 shows the circuit configuration of a principal part of a D/A converter according to Embodiment 4 of the invention.

In this embodiment, not only the three kinds of current sources 1 through 3 of Embodiment 1 shown in FIG. 1 but also the bias circuit 104 shown in FIG. 13 is described.

In FIG. 6, a reference numeral 15 denotes a part of the bias circuit 104 shown in FIG. 13. This bias circuit 15 is a circuit for generating a first bias voltage, in which the source terminal of a P-channel MOS transistor (i.e., a given transistor) Tr29 with a channel length L3 and a channel width W3 formed within a first transistor matrix 16 is connected to a power supply VDD and the drain terminal thereof is connected to the source terminal of a P-channel MOS transistor Tr30 with a channel length L4 and a channel width W4 formed within a second transistor matrix 17. The gate terminal of the P-channel MOS transistor Tr30 is connected to a second bias voltage terminal VB2 and the drain terminal thereof is connected to the gate terminal of the P-channel MOS transistor Tr29 formed within the first transistor matrix 16 and to a current output terminal Iout15. In this state, when the current output terminal Iout15 is connected to a current source, a bias voltage VB1 is generated. The bias voltage VB1 generated in the bias circuit 15 is supplied to respective current sources formed within the transistor matrixes, so that current values of the currents output from the respective current sources can be set to given values.

In this embodiment, since the bias circuit is provided within the transistor matrixes, the D/A converter can be highly precisely realized with variation of its output current suppressed.

In this manner, according to this embodiment, a current steering D/A converter with high output current accuracy, small fabrication variation and a small area can be realized.

Embodiment 5

Figure 7:
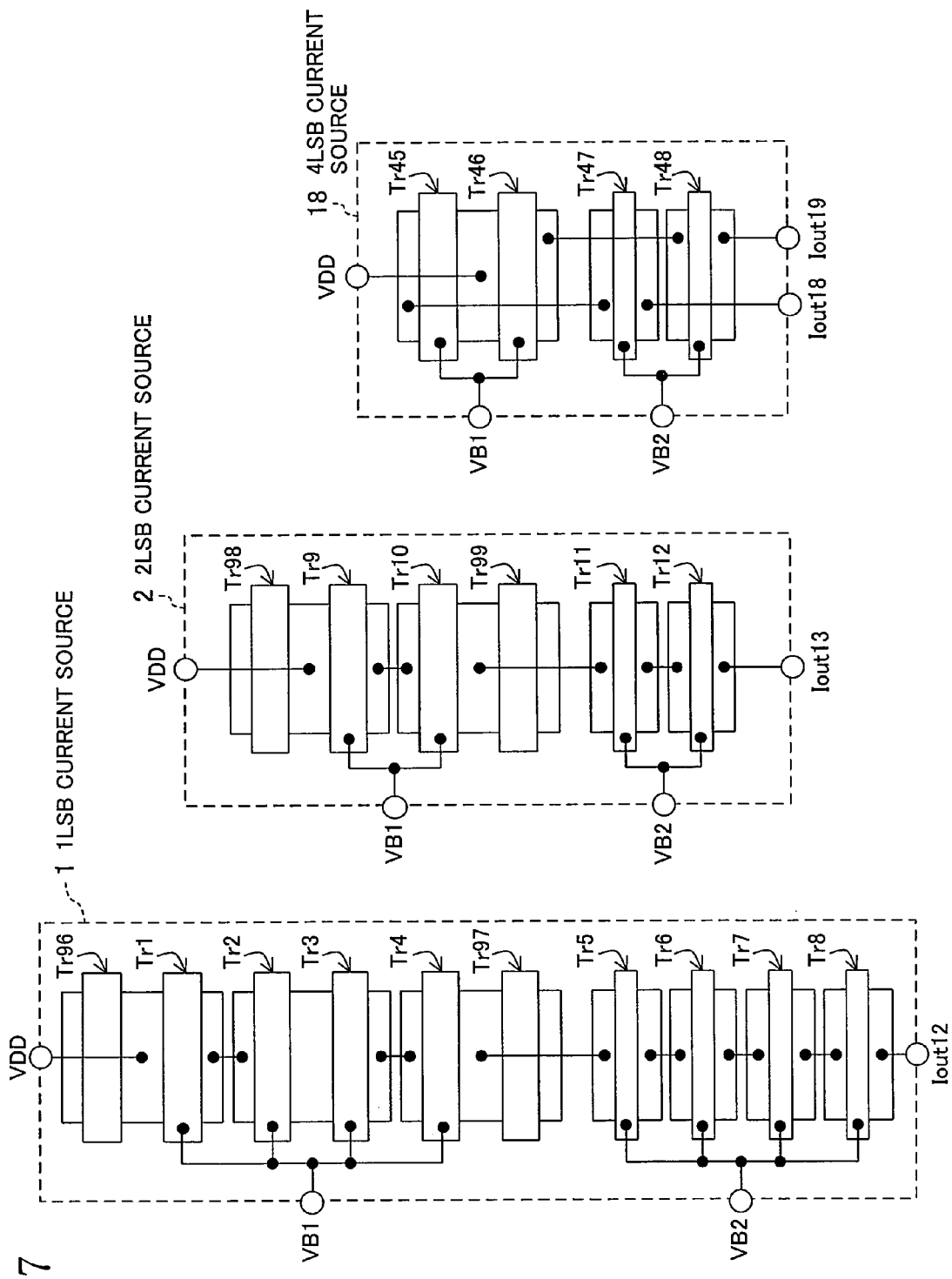
FIG. 7 is a diagram for showing the layout of current sources included in a D/A converter according to Embodiment 5 of the invention.

FIG. 7 is a diagram for showing the layout of current sources included in a D/A converter according to Embodiment 5 of the invention. In this embodiment, a diffusion layer is shared by two MOS transistors so as to reduce the area occupied by a current source matrix.

In FIG. 7, in a 1LSB current source 1, the drain terminal of a MOS transistor Tr2 shares a diffusion layer with the source terminal of a MOS transistor Tr3. Also, the source terminal of a MOS transistor Tr1 and the drain terminal of a MOS transistor Tr4 share diffusion layers respectively with dummy P-channel MOS transistors Tr96 and Tr97.

Furthermore, in a 2LSB current source 2, the source terminal of a MOS transistor Tr9 and the drain terminal of a MOS transistor Tr10 share diffusion layers respectively with dummy P-channel MOS transistors Tr98 and Tr99.

Moreover, a reference numeral 18 denotes a 4LSB current source that has a layout architecture including a combination of two 4LSB current sources. The source terminal of a P-channel MOS transistor Tr45 with a channel length L3 and a channel width W3 is connected to a power supply VDD, the gate terminal thereof is connected to a first bias voltage terminal VB1 and the drain terminal thereof is connected to the source terminal of a P-channel MOS transistor Tr47 with a channel length L4 and a channel width W4. The gate terminal of this MOS transistor Tr47 is connected to a second bias voltage terminal VB2, the drain terminal thereof is connected to a current output terminal Iout18, and a 4SLB current is output from the current output terminal Iout18. Simultaneously, the source terminal of a P-channel MOS transistor Tr46 with a channel length L3 and a channel width W3 is connected to the power supply VDD, the gate terminal thereof is connected to the first bias voltage terminal VB1 and the drain terminal thereof is connected to the source terminal of a P-channel MOS transistor Tr48 with a channel length L4 and a channel width W4. The gate terminal of this MOS transistor Tr48 is connected to the second bias terminal VB2, the drain terminal thereof is connected to a current output terminal Iout19, and a 4LSB current is output from the current output terminal Iout19.

In the current source 18, the source terminal of the MOS transistor Tr45 shares a diffusion layer with the source terminal of the MOS transistor Tr46.

In this embodiment, the MOS transistors included in a current source matrix share diffusion layers corresponding to their source/drain terminals, so as to advantageously realize a smaller current source matrix. Although the source/drain terminals of the MOS transistors included in the first MOS transistor matrix share the diffusion layers in this embodiment, the sharing of diffusion layers is not particularly limited to the first MOS transistor matrix.

In this manner, according to this embodiment, a current steering D/A converter including a current source matrix with a smaller area can be realized.

Embodiment 6

Figure 8:
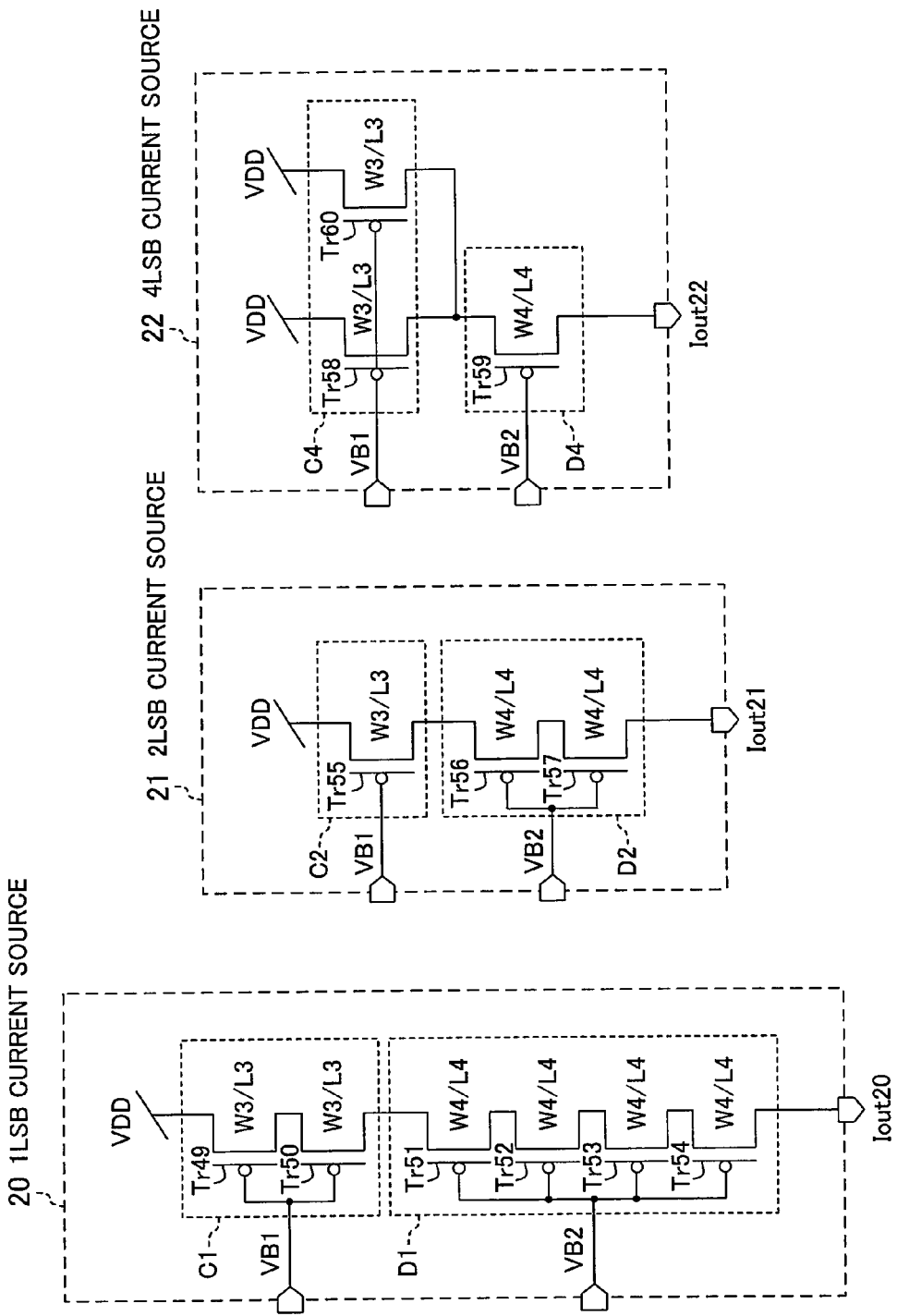
FIG. 8 is a circuit diagram of current sources included in a D/A converter according to Embodiment 6 of the invention.

FIG. 8 shows the circuit configurations of current sources included in a D/A converter according to Embodiment 6 of the invention. In FIG. 1 of Embodiment 1, in the three current sources 1 through 3, the number of transistors included in each of the first circuits A1, A2 and A3 is the same as that included in the corresponding one of the second circuits B1, B2 and B3, but the number of transistors is different in this embodiment.

In FIG. 8, a current source 20 is a 1LSB current source, a current source 21 is a 2LSB current source and a current source 22 is a 4LSB current source.

The 4LSB current source 22 includes cascade-connection of a first circuit C4 composed of two (namely, m=2) P-channel MOS transistors Tr58 and Tr60 connected in parallel with the drain terminal shared and a second circuit D4 composed of one (namely, n≠m) P-channel MOS transistor Tr59. In this current source 22, the two P-channel MOS transistors Tr58 and Tr60 with a channel length L3 and a channel width W3, which are connected to a power supply VDD at their source terminals and to a first bias voltage terminal VB1 at their gate terminals and share the drain terminal, are connected to the source terminal of the P-channel MOS transistor Tr59 with a channel length L4 and a channel width W4. The gate terminal of the MOS transistor Tr59 is connected to a second bias voltage terminal VB2 and the drain terminal thereof is connected to a current output terminal Iout22. Thus, a 4LSB current is output from the current output terminal Iout22.

The 2LSB current source 21 includes cascade-connection of a first circuit C2 composed of one P-channel MOS transistors Tr55 and a second circuit D2 composed of cascode-connected two (namely, n=2) P-channel MOS transistors Tr56 and Tr57. In this current source 21, the source terminal of the P-channel MOS transistor Tr55 with a channel length L3 and a channel width W3 is connected to a power supply VDD, the gate terminal thereof is connected to a first bias voltage terminal VB1 and the drain terminal thereof is connected to the source terminal of the P-channel MOS transistor Tr56 with a channel length L4 and a channel width W4. The gate terminal of the MOS transistor Tr56 is connected to a second bias voltage terminal VB2 and the drain terminal thereof is connected to the source terminal of the P-channel MOS transistor Tr57 with a channel length L4 and a channel width W4, and the gate terminal of the MOS transistor Tr57 is connected to the second bias voltage terminal VB2 and the drain terminal thereof is connected to a current output terminal Iout21. Thus, a current with a current value corresponding to a half of the output of the current source 22, namely, a 2LSB current, is output from the current output terminal Iout21.

The 1LSB current source 20 includes cascade-connection of a first circuit C1 composed of cascode-connected two P-channel MOS transistors Tr49 through Tr50 and a second circuit D1 composed of four (namely, n≠m=2) P-channel MOS transistors Tr51 through Tr54. In this current source 20, the source terminal of the P-channel MOS transistor Tr49 with a channel length L3 and a channel width W3 is connected to a power supply VDD, the gate terminal thereof is connected to a first bias voltage terminal VB1 and the drain terminal thereof is connected to the source terminal of the P-channel MOS transistor Tr50 with a channel length L3 and a channel width W3. The gate terminal of the MOS transistor Tr50 is connected to the first bias voltage terminal VB1 and the drain terminal thereof is connected to the source terminal of the P-channel MOS transistor Tr51 with a channel length L4 and a channel width W4, and the gate terminal of the MOS transistor Tr51 is connected to a second bias voltage terminal VB2 and the drain terminal thereof is connected to the source terminal of the P-channel MOS transistor Tr52 with a channel length L4 and a channel width W4. The gate terminal of the MOS transistor Tr52 is connected to the second voltage terminal VB2 and the drain terminal thereof is connected to the source terminal of the P-channel MOS transistor Tr53 with a channel length L4 and a channel width W4, and the gate terminal of the MOS transistor Tr53 is connected to the second bias voltage terminal VB2 and the drain terminal thereof is connected to the source terminal of the P-channel MOS transistor Tr54 with a channel length L4 and a channel width W4. The gate terminal of the MOS transistor Tr54 is connected to the second bias voltage terminal VB2 and the drain terminal thereof is connected to a current output terminal Iout20. Thus, a current with a current value corresponding to ¼ of the output of the current source 22, namely, a 1LSB current, is output from the current output terminal Iout20.

In addition, the MOS transistors having a size of the channel length L3 and the channel width W3 are formed in a first MOS transistor matrix, and the MOS transistors having a size of the channel length L4 and the channel width W4 are formed in a second MOS transistor matrix.

In this embodiment, the transistors are regularly arranged in the form of a complete matrix so as not to make any gap in the matrix. Therefore, they have an advantage that size variation derived from process accuracy in the fabrication is reduced so as to form the MOS transistors with uniform characteristics.

Furthermore, the output current value of each current source is determined principally by the P-channel MOS transistors having the size of the channel length L3 and the channel width W3, and since the MOS transistors having the size of the channel length L3 and the channel width W3 are disposed in a smaller area in the arrangement of this embodiment, unevenness among the current sources derived from the in-plane distribution of the current characteristic of the MOS transistors can be reduced, so as to advantageously improve the linearity characteristic of the D/A converter.

In this manner, according to this embodiment, a current steering D/A converter including transistor matrixes that are small in the fabrication variation, are more uniform and have smaller areas can be realized.

Modification of Embodiment 6

Figure 9:
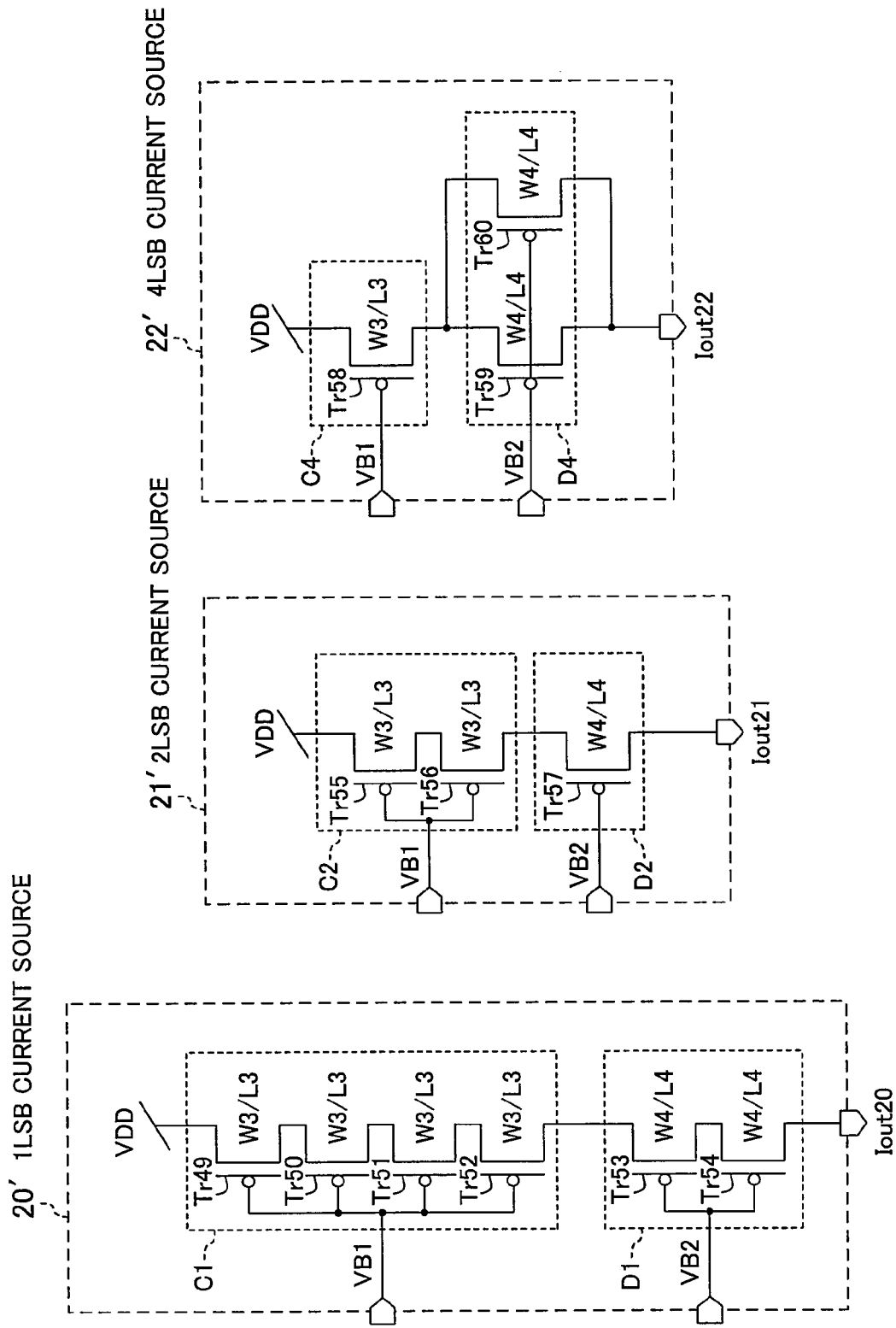
FIG. 9 is a diagram for showing a modification of the current sources of FIG. 8.

FIG. 9 shows a modification of Embodiment 6 of the invention.

In Embodiment 6 described above, the first circuit C2 of the 2LSB current source 21 is composed of one MOS transistor Tr55 as shown in FIG. 8, and in this modification, the second circuit used for setting high output impedance of the current source is composed of one MOS transistor.

Specifically, in a 4LSB current source 22' of FIG. 9, a first circuit C4 is composed of one P-channel MOS transistor Tr58 having a size of a channel length L3 and a channel width W3, and a second circuit D4 is composed of two P-channel MOS transistors Tr59 and Tr60 having a size of a channel length L4 and a channel width W4 connected in parallel with the source/drain terminals shared. Also, in a 2LSB current source 21', a first circuit C2 is composed of cascode-connection of two P-channel MOS transistors Tr55 and Tr56 having the size of the channel length L3 and the channel width W3, and a second circuit D2 is composed of one P-channel MOS transistor Tr57 having the size of the channel length L4 and the channel width W4. Furthermore, in a 1LSB current source 20', a first circuit C1 is composed of cascode-connection of four P-channel MOS transistors Tr49 through Tr52 having the size of the channel length L3 and the channel width W3, and a second circuit D1 is composed of cascode-connection of two P-channel MOS transistors Tr53 and Tr54 having the size of the channel length L4 and the channel width W4.

Accordingly, the same functions and effects as those of Embodiment 6 can be attained in this modification.

Embodiment 7

Figure 10:
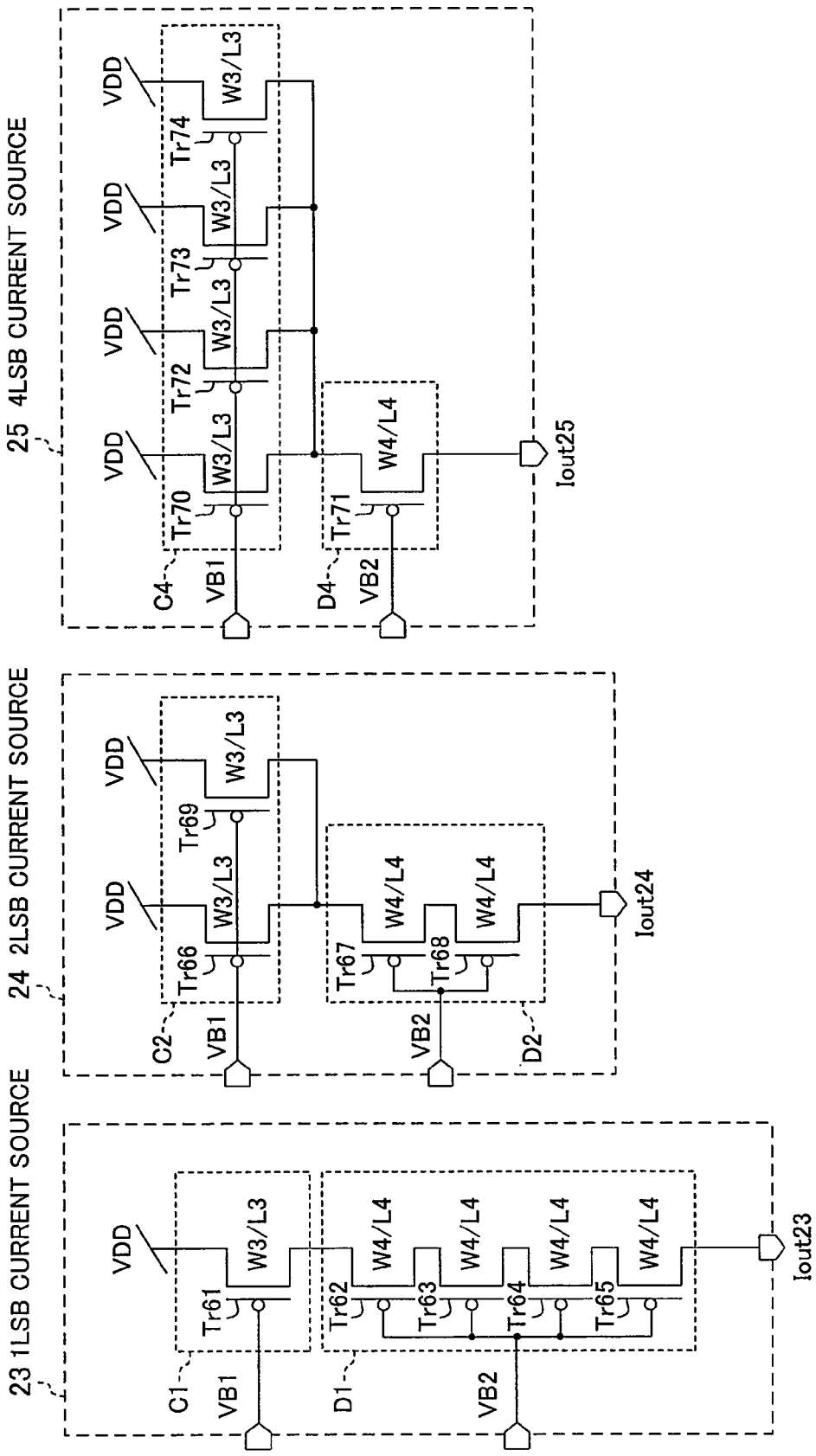
FIG. 10 is a circuit diagram of current sources included in a D/A converter according to Embodiment 7 of the invention.

FIG. 10 shows the circuit configurations of current sources included in a D/A converter according to Embodiment 7 of the invention. While the first circuit C2 of the 2LSB current source 21 is composed of one MOS transistor Tr55 as shown in FIG. 8 in Embodiment 6, a first circuit C1 of a 1LSB current source 23 is composed of one MOS transistor Tr61 in this embodiment.

Specifically, in FIG. 10, a current source 23 is a 1LSB current source, a current source 24 is a 2LSB current source and a current source 25 is a 4LSB current source.

The 4LSB current source 25 includes cascade-connection of a first circuit C4 composed of four (namely, m=4) P-channel MOS transistors Tr70 and Tr72 through Tr74 and a second circuit D4 composed of one (namely, n=1) P-channel MOS transistor Tr71. In this current source 25, the four P-channel MOS transistors Tr70, Tr72, Tr73 and Tr74 with a channel length L3 and a channel width W3, which are connected to a power supply VDD at their source terminals and to a first bias voltage terminal VB1 at their gate terminals and share the drain terminal, are connected to the source terminal of the P-channel MOS transistor Tr71 with a channel length L4 and a channel width W4. The gate terminal of the MOS transistor Tr71 is connected to a second bias voltage terminal VB2 and the drain terminal thereof is connected to a current output terminal Iout25. Thus, a 4LSB current is output from the current output terminal Iout25.

The 2LSB current source 24 includes cascade-connection of a first circuit C2 composed of two (i.e., m=2) P-channel MOS transistors Tr66 and Tr69 connected in parallel with the drain terminal shared and a second circuit D2 composed of cascode-connected two (namely, n=2) P-channel MOS transistors Tr67 and Tr68. In this current source 24, the two P-channel MOS transistors Tr66 and Tr69 with a channel length L3 and a channel width W3, which are connected to a power supply VDD at their source terminals and to a first bias voltage terminal VB1 at their gate terminals and share the drain terminal, are connected to the source terminal of the P-channel MOS transistor Tr67 with a channel length L4 and a channel width W4. The gate terminal of the MOS transistor Tr67 is connected to a second bias voltage terminal VB2 and the drain terminal thereof is connected to the source terminal of the P-channel MOS transistor Tr68 with a channel length L4 and a channel width W4, and the gate terminal of the MOS transistor Tr68 is connected to the second bias voltage terminal VB2 and the drain terminal thereof is connected to a current output terminal Iout24. Thus, a current with a current value corresponding to a half of the output of the current source 25, namely, a 2LSB current, is output from the current output terminal Iout24.

The 1LSB current source 23 includes cascade-connection of a first circuit C1 composed of one P-channel MOS transistor Tr61 and a second circuit D1 composed of cascode-connected four (namely, n=4) P-channel MOS transistors Tr62 through Tr65. In this current source 23, the source terminal of the P-channel MOS transistor Tr61 with a channel length L3 and a channel width W3 is connected to a power supply VDD, the gate terminal thereof is connected to a first bias voltage terminal VB1 and the drain terminal thereof is connected to the source terminal of the P-channel MOS transistor Tr62 with a channel length L4 and a channel width W4. The gate terminal of the MOS transistor Tr62 is connected to a second bias voltage terminal VB2, the drain terminal thereof is connected to the source terminal of the P-channel MOS transistor Tr63 with a channel length L4 and a channel width W4, and the gate terminal of the MOS transistor Tr63 is connected to the second bias voltage terminal VB2 and the drain terminal thereof is connected to the source terminal of the P-channel MOS transistor Tr64 with a channel length L4 and a channel width W4. The gate terminal of the MOS transistor Tr64 is connected to the second voltage terminal VB2 and the drain terminal thereof is connected to the source terminal of the P-channel MOS transistor Tr65 with a channel length L4 and a channel width W4, and the gate terminal of the MOS transistor Tr65 is connected to the second bias voltage terminal VB2 and the drain terminal thereof is connected to a current output terminal Iout23. Thus, a current with a current value corresponding to ¼ of the output of the current source 25, namely, a 1LSB current, is output from the current output terminal Iout23.

In addition, the MOS transistors having a size of the channel length L3 and the channel width W3 are formed in a first MOS transistor matrix, and the MOS transistors having a size of the channel length L4 and the channel width W4 are formed in a second MOS transistor matrix.

In this embodiment, the transistors are regularly arranged in the form of a complete matrix so as not to make any gap in the matrix. Therefore, they have an advantage that size variation derived from process accuracy in the fabrication is reduced so as to form the MOS transistors with uniform characteristics.

Furthermore, since the MOS transistors having the size of the channel length L4 and the channel width W4 are disposed in a smaller area in the arrangement of this embodiment, unevenness among the current sources derived from the in-plane distribution of the current characteristic of the MOS transistors can be reduced, so as to advantageously improve the linearity characteristic of the D/A converter.

In this manner, according to this embodiment, a current steering D/A converter including transistor matrixes that are small in the fabrication variation, are more uniform and have smaller areas can be realized.

Modification of Embodiment 7

Figure 11:
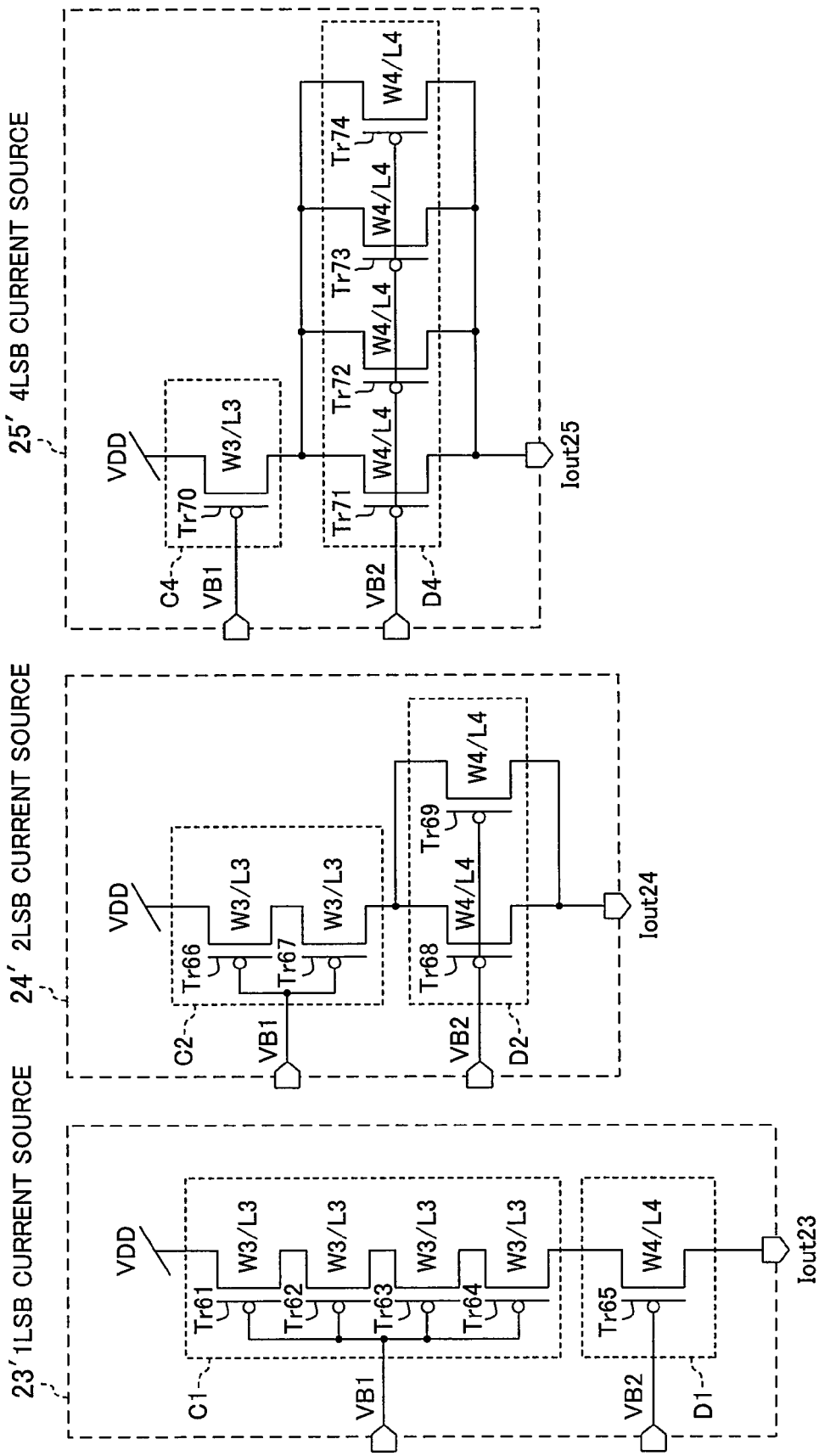
FIG. 11 is a diagram for showing a modification of the current sources of FIG. 10.

FIG. 11 shows a modification of Embodiment 7 of the invention.

In Embodiment 7 described above, the first circuit C1 of the 1LSB current source 23 is composed of one MOS transistor Tr61 as shown in FIG. 10, and in this modification, the second circuit D1 is composed of one MOS transistor.

Specifically, in a 4LSB current source 25' of FIG. 11, a first circuit C4 is composed of one P-channel MOS transistor Tr70 with a channel length L3 and a channel width W3 and a first bias voltage terminal VB1, and a second circuit D4 is composed of four P-channel MOS transistors Tr71 through Tr74 with a channel length L4 and a channel width W4 connected in parallel with the source/drain terminals shared and connected to a second bias voltage terminal VB2 at their gate terminals. Also, in a 2LSB current source 24', a first circuit C2 is composed of cascode-connection of two P-channel MOS transistors Tr66 and Tr67 with a channel length L3 and a channel width W3 connected to a first bias voltage terminal VB1 at their gate terminals, and a second circuit D2 is composed of two P-channel MOS transistors Tr68 and Tr69 with a channel length L4 and a channel width W4 connected in parallel with the source/drain terminals shared and connected to a second bias voltage terminal VB2 at their gate terminals. Furthermore, in a 1LSB current source 23', a first circuit C1 is composed of cascode-connection of four P-channel MOS transistors Tr61 through Tr64 with a channel length L3 and a channel width W3 connected to a first bias voltage terminal VB1 at their gate terminals, and a second circuit D1 is composed of one P-channel MOS transistors Tr65 with a channel length L4 and a channel width W4 and a second bias voltage terminal VB2.

Accordingly, the same functions and effects as those of Embodiment 7 can be attained in this modification.

Embodiment 8

Figure 12:
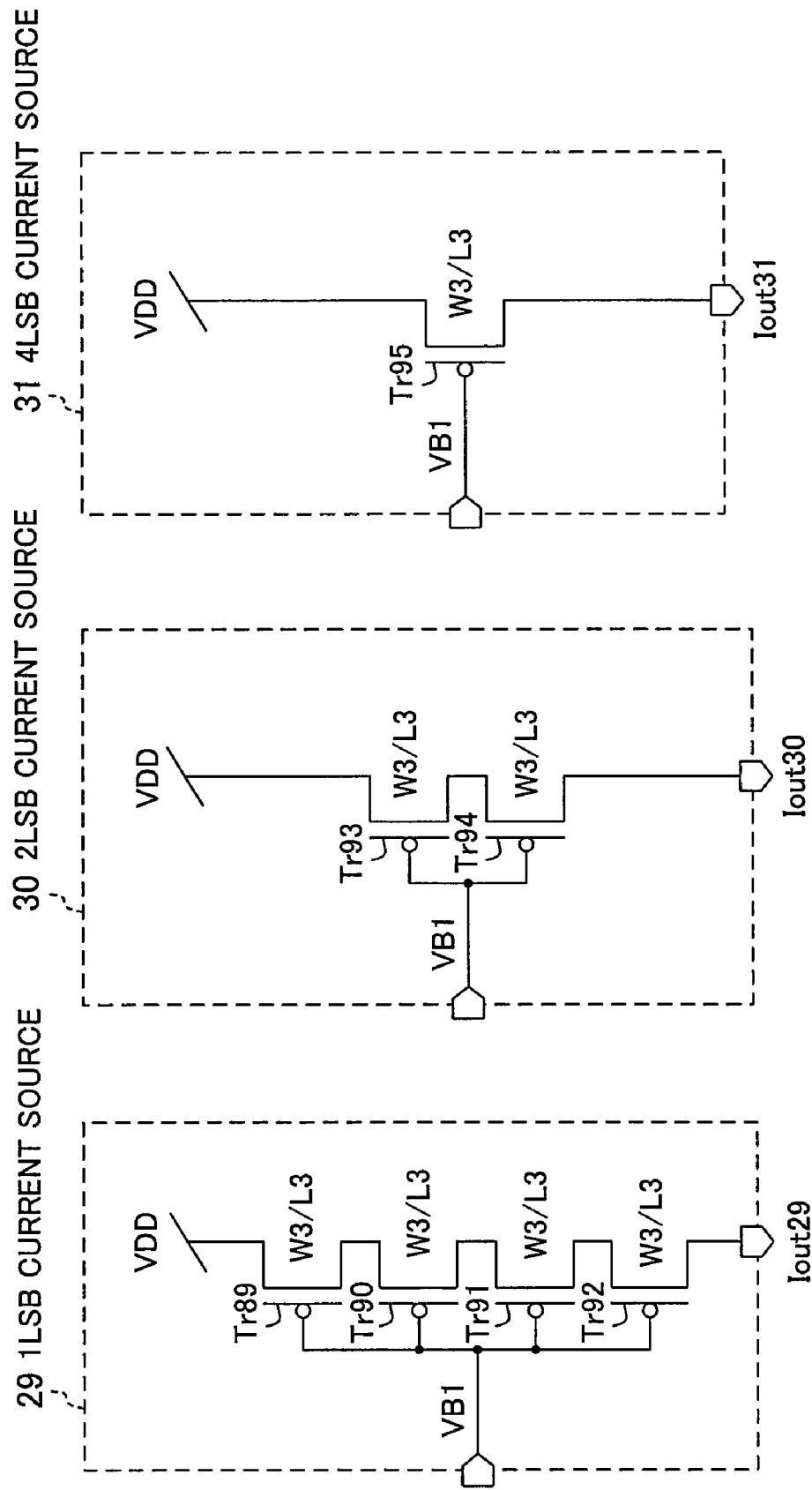
FIG. 12 is a circuit diagram of current sources included in a D/A converter according to Embodiment 8 of the invention.

FIG. 12 is a diagram for showing the circuit configurations of current sources included in a D/A converter according to Embodiment 8 of the invention. In summary, a second circuit included in each current source, namely, a circuit used for setting high output impedance of a constant current source, is not employed in this embodiment.

Specifically, in FIG. 12, a current source 29 is a 1LSB current source, a current source 30 is a 2LSB current source and a current source 31 is a 4LSB current source.

In the current source 31, the source terminal of a P-channel MOS transistor Tr95 with a channel length L3 and a channel width W3 is connected to a power supply VDD, the gate terminal thereof is connected to a first bias current terminal VB1 and the drain terminal thereof is connected to a current output terminal Iout31. Thus, a 4LSB current is output from the current output terminal Iout31.

In the current source 30, the source terminal of a P-channel MOS transistor Tr93 with a channel length L3 and a channel width W3 is connected to a power supply VDD, the gate terminal thereof is connected to a first bias voltage terminal VB1 and the drain terminal thereof is connected to the source terminal of a P-channel MOS transistor Tr94 with a channel length L3 and a channel width W3, and the gate terminal of the MOS transistor Tr94 is connected to the first bias voltage terminal VB1 and the drain terminal thereof is connected to a current output terminal Iout30. Thus, a current with a current value corresponding to a half of the output of the current source 31, namely, a 2LSB current, is output from the current output terminal Iout30.

In the current source 29, the source terminal of a P-channel MOS transistor Tr89 with a channel length L3 and a channel width W3 is connected to a power supply VDD, the gate terminal thereof is connected to a first bias voltage terminal VB1 and the drain terminal thereof is connected to the source terminal of a P-channel MOS transistor Tr90 with a channel length L3 and a channel width W3. The gate terminal of the MOS transistor Tr90 is connected to the first bias voltage terminal VB1 and the drain terminal thereof is connected to the source terminal of a P-channel MOS transistor Tr91 with a channel length L3 and a channel width W3, and the gate terminal of the MOS transistor Tr91 is connected to the first bias voltage terminal VB1 and the drain terminal thereof is connected to the source terminal of a P-channel MOS transistor Tr92 with a channel length L3 and a channel width W3. The gate terminal of the MOS transistor Tr92 is connected to the first bias voltage terminal VB1 and the drain terminal thereof is connected to a current output terminal Iout29. Thus, a current with a current value corresponding to ¼ of the output of the current source 31, namely, a 1LSB current, is output from the current output terminal Iout29.

In this embodiment, MOS transistors of which size is different from the size of the channel length L3 and the channel width W3 are not necessary for the current sources. Therefore, the size of the current source matrix can be advantageously suppressed to be small.

Furthermore, in this embodiment, the transistors are regularly arranged in the form of a complete matrix so as not to make any gap in the matrix. Therefore, they have an advantage that size variation derived from process accuracy in the fabrication is reduced so as to form the MOS transistors with uniform characteristics.

In this manner, according to this embodiment, a current steering D/A converter including a transistor matrix that is small in the fabrication variation, is more uniform and has smaller areas can be realized.

Although an 8-bit D/A converter is described in each embodiment, the bit number is not particularly specified in this invention.

Although a current source described in each embodiment is designed with a thermometer code in a higher bit portion and with a binary code in a lower bit portion, the invention is applicable to a current source designed with a thermometer code in a higher bit portion, with a thermometer code also in an intermediate bit portion and with a binary code in a lower bit portion, and thus, the structure of the current source is not particularly specified.

Furthermore, although a D/A converter alone is described in each embodiment, the present invention is not limited to the D/A converter, and needless to say, the invention is applicable to a semiconductor integrated circuit including such a D/A converter.

INDUSTRIAL APPLICABILITY

As described so far, according to the present invention, the current characteristic of all MOS transistors can be made uniform on a plane of a current source matrix while effectively reducing the circuit areas of all current sources included in a D/A converter, and thus, the linearity of the D/A conversion characteristic can be further improved. Therefore, the invention is useful for a D/A converter and a semiconductor integrated circuit including the same.

The invention claimed is:

1. A D/A converter for converting a set of digital signals into an analog signal comprising:
    a current source,
    a switch,
    wherein said current source is composed of a first circuit and a second circuit cascade-connected to each other,
    said first circuit includes cascade-connection of m (wherein m is an integer not less than 2) field effect transistors having a first size with a first bias voltage commonly applied to gate terminals of said m field effect transistors, and said second circuit includes cascode-connection of m field effect transistors having a second size with a second bias voltage commonly applied to gate terminals of said m field effect transistors, and said switch has a terminal connected to the current source.

2. A semiconductor integrated circuit comprising the D/A converter of claim 1.

3. A semiconductor integrated circuit comprising the D/A converter of claim 2.

4. A D/A converter for converting a set of digital signals into an analog signal comprising:
- a current source,
- a switch,
- wherein said current source is composed of a first circuit and a second circuit cascade-connected to each other,
- said first circuit includes parallel-connection of m (wherein m is an integer not less than 2) field effect transistors having a first size with a first bias voltage commonly applied to gate terminals of said m field effect transistors, and
- said second circuit includes cascode-connection of m field effect transistors having a second size with a second bias voltage commonly applied to gate terminals of said m field effect transistors, and
- said switch has a terminal connected to the current source.

5. A semiconductor integrated circuit comprising the D/A converter of claim 4.

6. A semiconductor integrated circuit comprising the D/A converter of claim 5.

* * * * *